United States Patent
Miyazaki

(10) Patent No.: US 11,257,536 B2
(45) Date of Patent: Feb. 22, 2022

(54) SEMICONDUCTOR STORAGE DEVICE AND CONTROL METHOD THEREOF

(71) Applicant: KIOXIA CORPORATION, Tokyo (JP)

(72) Inventor: Takayuki Miyazaki, Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/002,512

(22) Filed: Aug. 25, 2020

(65) Prior Publication Data
US 2021/0295892 A1 Sep. 23, 2021

(30) Foreign Application Priority Data
Mar. 18, 2020 (JP) .............................. JP2020-047332

(51) Int. Cl.
| G11C 16/04 | (2006.01) |
| G11C 11/4074 | (2006.01) |
| G11C 11/4076 | (2006.01) |
| G11C 5/02 | (2006.01) |
| G11C 11/4094 | (2006.01) |
| G11C 5/06 | (2006.01) |
| G11C 11/408 | (2006.01) |

(52) U.S. Cl.
CPC .......... *G11C 11/4074* (2013.01); *G11C 5/025* (2013.01); *G11C 5/06* (2013.01); *G11C 11/4076* (2013.01); *G11C 11/4085* (2013.01); *G11C 11/4094* (2013.01)

(58) Field of Classification Search
CPC ....... G11C 11/4074; G11C 5/025; G11C 5/06; G11C 11/4076; G11C 11/4085; G11C 11/4094
USPC .................................... 365/163, 148, 185.17
See application file for complete search history.

(56) References Cited

U.S. PATENT DOCUMENTS

| 9,030,906 B2 | 5/2015 | Rivers et al. |
| 9,142,271 B1 | 9/2015 | Srinivasan et al. |
| 9,747,978 B2 | 8/2017 | Srinivasan et al. |
| 2011/0211391 A1* | 9/2011 | Parkinson .......... G11C 13/0069 365/163 |

* cited by examiner

*Primary Examiner* — Huan Hoang
(74) *Attorney, Agent, or Firm* — Kim & Stewart LLP

(57) ABSTRACT

A semiconductor storage device includes a first wiring, a second wiring, a memory cell including a first element configured to store data and a second element connected to the first element, the memory cell having a first end connected to the first wiring and a second end connected to the second wiring, and a control circuit configured to apply a voltage that increase with a first slope and then with a second slope that is smaller than the first slope, to the memory cell using the first wiring and the second wiring.

18 Claims, 24 Drawing Sheets

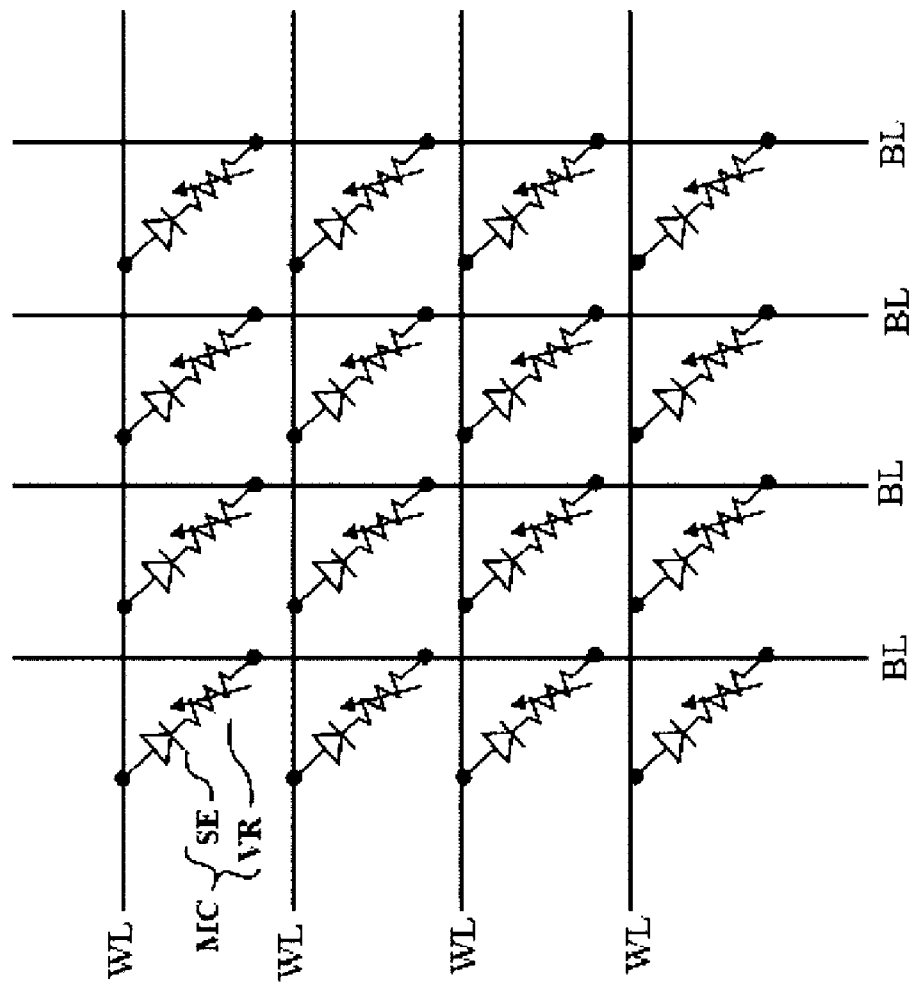

START TO INCREASE VOLTAGE WITH FIRST SLOPE    SWITCH TO SECOND SLOPE

SEMICONDUCTOR STORAGE DEVICE AND CONTROL METHOD THEREOF

CROSS-REFERENCE TO RELATED APPLICATION(S)

This application is based upon and claims the benefit of priority from Japanese Patent Application No. 2020-047332, filed Mar. 18, 2020, the entire contents of which are incorporated herein by reference.

FIELD

Embodiments described herein relate generally to a semiconductor storage device and a control method thereof.

BACKGROUND

In recent years, various semiconductor storage devices such as phase-change memory (PCM), resistive random access memory (ReRAM), and magnetoresistive random access memory (MRAM) have been researched and developed. In such devices, it is preferable that data can be read and written without applying stress to a memory cell.

BRIEF DESCRIPTION OF THE DRAWINGS

FIGS. 3A and 3B are schematic diagrams showing a memory cell array according to the embodiment.

DETAILED DESCRIPTION

Figure 1:
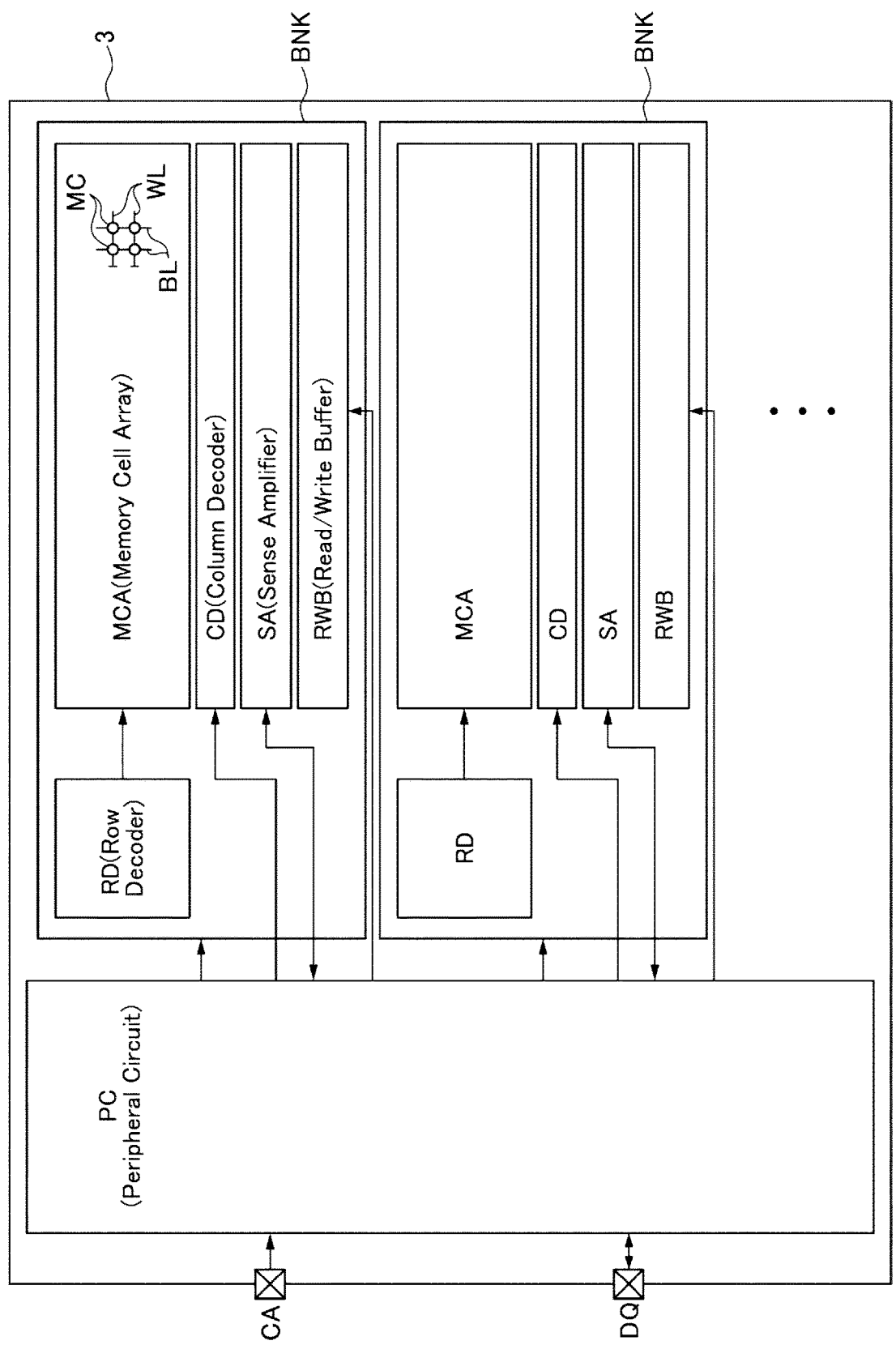
FIG. 1 is a block diagram showing a configuration of a semiconductor storage device according to an embodiment.

Embodiments provide a highly reliable semiconductor storage device.

In general, according to one embodiment, a semiconductor manufacturing device includes a first wiring, a second wiring, a memory cell including a first element that stores data and a second element that is connected to the first element, the memory cell having a first end connected to the first wiring and a second end connected to the second wiring, and a control circuit configured to apply a voltage that increases with a first slope and then with a second slope that is smaller than the first slope, to the memory cell using the first wiring and the second wiring.

Embodiments will be described below with reference to drawings. In the drawings, same or similar elements are denoted by same or similar reference numerals.

Embodiment

FIG. 1 is a block diagram showing a configuration of a semiconductor storage device 3 according to the present embodiment.

The semiconductor storage device according to the present embodiment is, for example, a volatile memory such as a dynamic random access memory (DRAM), or a nonvolatile memory such as a PCM, a NAND type electrically erasable and programmable read-only-memory (EEPROM), a ReRAM, or an MRAM.

The semiconductor storage device 3 shown in FIG. 1 includes a memory cell array MCA, a column decoder CD, a row decoder RD, a sense amplifier SA, a read/write buffer RWB, and a peripheral circuit PC.

The memory cell array MCA includes, for example, a plurality of memory cells MC arranged two-dimensionally in a matrix configuration. The memory cells MC are, for example, resistance change type memories such as PCMs. Each memory cell MC is arranged, for example, at an intersecting point of a bit line BL and a word line WL. That is, the memory cell array MCA is a so-called cross-point type memory cell array. The bit line BL is substantially orthogonal to the word line WL when viewed from the above or from a side of a semiconductor substrate. Each of a plurality of bit lines BL is connected to one end of each of respective memory cells MC of the memory cell array MCA. Each of a plurality of word lines WL is connected to a gate terminal of each of respective memory cells MC of the memory cell array MCA. The memory cell arrays MCA are divided into a plurality of banks BNK in one chip, and each of the banks BNK is provided with the sense amplifier SA, the read/write buffer RWB, the row decoder RD, and the column decoder CD.

The sense amplifier SA is connected to the memory cell MC via the bit line BL, for example, and applies a write voltage or a read voltage to the memory cell MC via the bit line BL. The sense amplifier SA writes data into the memory cell MC by applying the write voltage to the memory cell MC, or reads data from the memory cell MC by applying the read voltage to the memory cell MC.

The read/write buffer RWB temporarily stores the data detected by the sense amplifier SA for each page, or temporarily stores data to be written into the memory cell array MCA for each page.

The row decoder RD and the column decoder CD access the memory cell array MCA based on a bank address and a page address, and apply a write voltage or a read voltage to the word line WL or the bit line BL. The row decoder RD applies a write voltage or a read voltage to a selected word line selected from the plurality of word lines WL. The column decoder CD connects a selected bit line selected from the plurality of bit lines BL to the sense amplifier SA. The sense amplifier SA applies a write voltage or a read voltage to the selected bit line. Accordingly, semiconductor storage device 3 can write data into a desired memory cell MC or read data from a desired memory cell MC in the memory cells MC.

Figure 2:
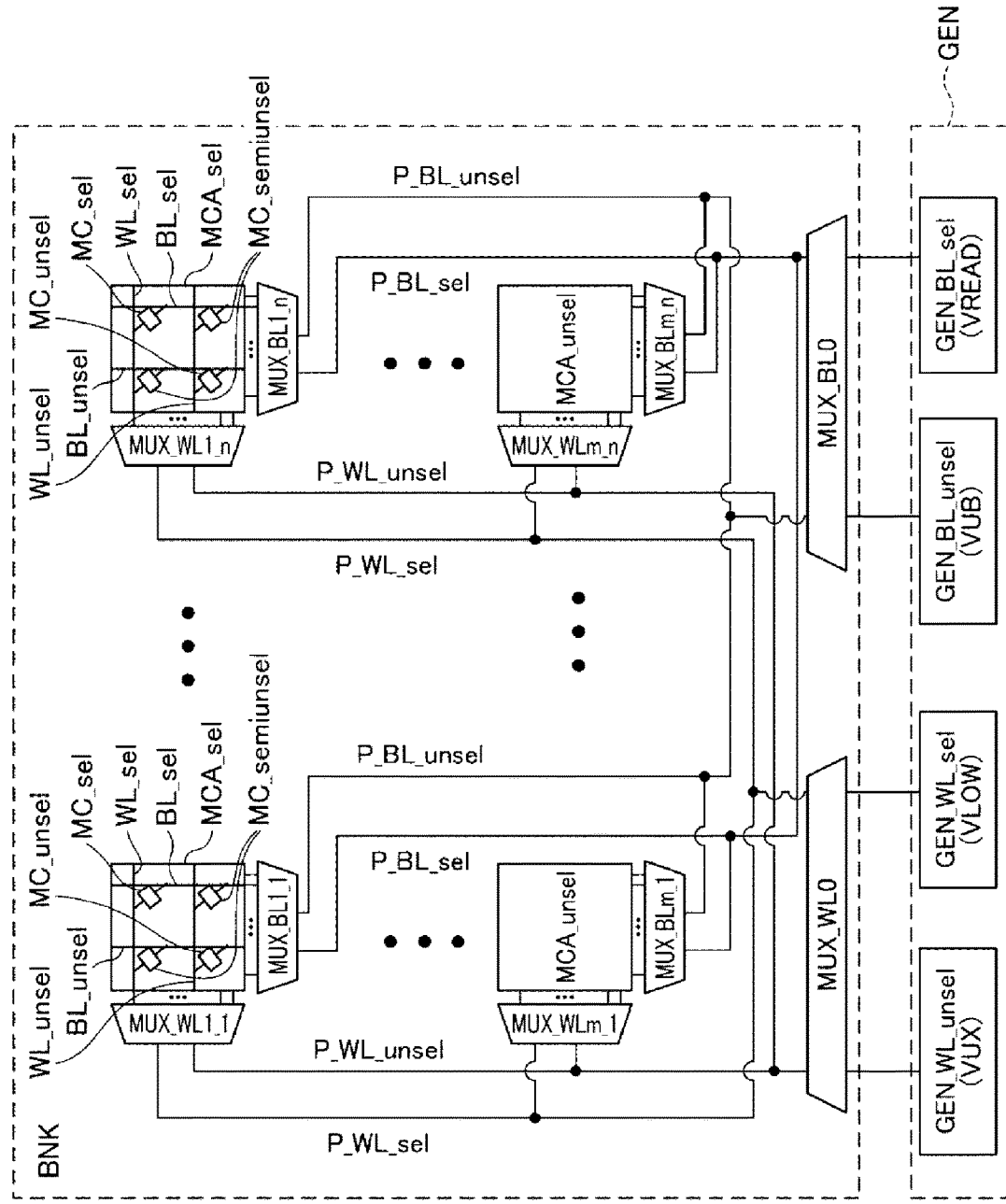
FIG. 2 is a block diagram showing a configuration of the semiconductor storage device according to the embodiment.

The peripheral circuit PC includes, for example, a voltage generation circuit, a read and write engine, an address controller, a command controller, an input and output circuit, and the like (not shown). The voltage generation circuit GEN generates a voltage of the word line WL or a voltage of the bit line BL that is necessary for a data reading operation and a data writing operation. A more detailed configuration of the voltage generation circuit GEN is shown in FIG. 2. The read and write engine controls the column decoder CD and the row decoder RD to write data into the desired memory cell MC in the bank BNK, or reads data from the desired memory cell MC in the bank BNK according to a command and the address. The read and write engine transfers the read data to a DQ buffer in the input and output circuit. The address controller receives a row address, a column address, and the like, and decodes these addresses. The command controller receives commands indicating various operations such as a data reading operation and a data writing operation, and transfers the commands to the read and write engine. The input and output circuit (IO) takes in the commands and the addresses from a CA terminal CA, transfers the commands to the command controller, and transfers the addresses to the address controller. The command may be a write command instructing a write operation or a read command instructing a read operation. The address may be the bank address indicating any bank BNK of the memory cell array MCA and an address indicating a page to be read or written or the memory cell MC in the bank BNK. The input and output circuit takes in write data from the DQ terminal and transfers the write data to the read and write buffer RWB. Alternatively, the input and output circuit receives read data stored in a data latch DL and outputs the read data to the DQ terminal.

A memory controller (not shown) may be provided outside the semiconductor storage device 3. A memory system may include the plurality of semiconductor storage devices 3 and the memory controller (not shown) that controls all semiconductor storage devices 3.

FIG. 2 is a block diagram showing a more detailed configuration example of the bank BNK, the column decoder CD, and the row decoder RD in the semiconductor storage device 3. The column decoder CD includes multiplexers MUX_BL1_1 to MUX_BLm_n, and MUX_BL0. The row decoder RD includes multiplexers MUX_WL1_1 to MUX_WLm_n, and MUX_WL0. The bank BNK includes a plurality of memory cell arrays MCA subdivided in correspondence with the multiplexers MUX_BL1_1 to MUX_BLm_n and MUX_WL1_1 to MUX_WLm_n.

As shown in FIG. 2, the semiconductor storage device 3 further includes bit line paths P_BL_sel and P_BL_unsel, word line paths P_WL_sel and P_WL_unsel, a selected BL voltage generation circuit GEN_BL_sel, a non-selected BL voltage generation circuit GEN_BL_unsel, a selected WL voltage generation circuit GEN_WL_sel, and a non-selected WL voltage generation circuit GEN_WL_unsel.

Each multiplexer includes a switching element such as a metal oxide semiconductor field effect transistor (MOSFET).

The column decoder CD includes the multiplexers MUX_BL1_1 to MUX_BLm_n, and MUX_BL0. Each of the multiplexers MUX_BL1_1 to MUX_BLm_n is provided in correspondence with a respective one of the memory cell arrays MCA, and is connected to a plurality of bit lines BL of the respective one of the memory cell arrays MCA. m and n are each an integer of equal to or more than 1.

The multiplexers MUX_BL1_1 to MUX_BLm_n connect one selected bit line BL_sel selected from the bit lines BL of the corresponding memory cell array MCA to the selected bit line path P_BL_sel, and apply a selected bit line voltage V_bl_sel. The multiplexers MUX_BL1_1 to MUX_BLm_n connect a non-selected bit line BL_unsel, which is a bit line that is not the selected bit line BL_sel, to a non-selected bit line path P_BL_unsel, and apply a non-selected bit line voltage V_bl_unsel.

The multiplexer MUX_BL0 is connected between the selected BL voltage generation circuit GEN_BL_sel and the plurality of bit line paths, and between the non-selected BL voltage generation circuit GEN_BL_unsel and the plurality of bit line paths. The multiplexer MUX_BL0 connects one bit line path selected among the plurality of bit line paths to the selected BL voltage generation circuit GEN_BL_sel as the selected bit line path P_BL_sel. On the other hand, the multiplexer MUX_BL0 connects the non-selected bit line path among the plurality of bit line paths to the non-selected BL voltage generation circuit GEN_BL_unsel as the P_BL_unsel.

The bit line paths P_BL_sel and P_BL_unsel are wiring paths connected between the multiplexers MUX_BL1_1 to MUX_BLm_n and the multiplexer MUX_BL0. For example, 16, 32, 64, or 1024 bit line paths are provided. As described above, the multiplexer MUX_BL0 selects one among the plurality of bit line paths, and connects the selected bit line path P_BL_sel to the selected BL voltage generation circuit GEN_BL_sel. The selected bit line path P_BL_sel transmits the selected bit line voltage V_bl_sel. On the other hand, the multiplexer MUX_BL0 connects the non-selected bit line path P_BL_unsel among the plurality of bit line paths to the non-selected BL voltage generation circuit GEN_BL_unsel. The bit line path P_BL_unsel transmits the non-selected bit line voltage V_bl_unsel.

The selected BL voltage generation circuit GEN_BL_sel generates the selected bit line voltage V_bl_sel to be applied to the selected bit line BL_sel from an external power supply. The selected bit line voltage V_bl_sel is a high level voltage, for example, of several volts. The selected bit line path P_BL_sel transmits the selected bit line voltage V_bl_sel from the multiplexer MUX_BL0 to the multiplexers MUX_BL1_1 to MUX_BLm_n. The multiplexers MUX_BL1_1 to MUX_BLm_n and MUX_BL0 electrically connect the selected bit line BL_sel in the plurality of bit lines BL to the selected BL voltage generation circuit GEN_BL_sel via the selected bit line path P_BL_sel, and selectively apply the selected bit line voltage V_bl_sel to the selected bit line BL_sel.

The non-selected BL voltage generation circuit GEN_BL_unsel generates the non-selected bit line voltage V_bl_unsel applied to the non-selected bit line BL_unsel from the external power supply. The non-selected bit line voltage V_bl_unsel is a voltage between the selected bit line voltage V_bl_sel and the selected word line voltage V_wl_sel, and is, for example, V_bl_sel/2. The non-selected bit line path P_BL_unsel transmits the non-selected bit line voltage V_bl_unsel from the multiplexer MUX_BL0 to the multiplexers MUX_BL1_1 to MUX_BLm_n. The multiplexers MUX_BL0, MUX_BL1_1 to MUX_BLm_n electrically connect the non-selected bit line BL_unsel to the non-selected BL voltage generation circuit GEN_BL_unsel via the non-selected bit line path P_BL_unsel, and selectively apply the non-selected bit line voltage V_bl_unsel to the non-selected bit line BL_unsel.

The row decoder RD includes the multiplexers MUX_WL1_1 to MUX_WLm_n, and MUX_WL0. Each of the multiplexers MUX_WL1_1 to MUX_WLm_n is provided in correspondence with a respective one of the memory cell arrays MCA, and is connected to a plurality of word lines WL of the respective one of the memory cell arrays MCA.

The multiplexers MUX_WL1_1 to MUX_WLm_n connect one selected word line WL_sel selected from the word lines WL of the corresponding memory cell array MCA to the word line path P_WL_sel, and apply a selected word line voltage V_wl_sel. The multiplexers MUX_WL1_1 to MUX_WLm_n connect a non-selected word line WL_unsel, which is a word line that is not the selected word line WL_sel, to the word line path P_WL_unsel and apply a non-selected word line voltage V_wl_unsel. The multiplexer MUX_WL0 is connected between the selected WL voltage generation circuit GEN_WL_sel and the plurality of word line paths, and between the non-selected WL voltage generation circuit GEN_WL_unsel and the plurality of word line paths. The multiplexer MUX_WL0 connects one word line path selected among the plurality of word line paths to the selected WL voltage generation circuit GEN_WL_sel as the P_WL_sel. On the other hand, the multiplexer MUX_WL0 connects the non-selected word line path among the plurality of word line paths to the non-selected WL voltage generation circuit GEN_WL_unsel as the P_WL_unsel.

The word line paths P_WL_sel and P_WL_unsel are wiring paths connected between the multiplexers MUX_WL1_1 to MUX_WLm_n and the multiplexer MUX_WL0. For example, 16, 32, 64, or 1024 word line paths are provided. As described above, the multiplexer MUX_WL0 selects one among the plurality of word line paths, and connects the selected word line path P_WL_sel to the selected WL voltage generation circuit GEN_WL_sel. The selected word line path P_WL_sel transmits the selected word line voltage V_wl_sel. On the other hand, the multiplexer MUX_WL0 connects the non-selected word line path P_WL_unsel among the plurality of word line paths to the non-selected WL voltage generation circuit GEN_WL_unsel. The word line path P_WL_unsel transmits the non-selected word line voltage V_wl_unsel. The selected WL voltage generation circuit GEN_WL_sel generates the selected word line voltage V_wl_sel to be applied to the selected word line WL_sel from the external power supply. The selected word line voltage V_wl_sel is a low level voltage, for example, a ground voltage (0V). The selected word line path P_WL_sel transmits the selected word line voltage V_wl_sel from the multiplexer MUX_WL0 to the multiplexers MUX_WL1_1 to MUX_WLm_n. The multiplexers MUX_WL1_1 to MUX_WLm_n and MUX_WL0 electrically connect the selected word line WL_sel in the plurality of word lines WL to the selected WL voltage generation circuit GEN_WL_sel via the selected word line path P_WL_sel, and selectively apply the selected word line voltage V_wl_sel to the selected word line WL_sel.

The non-selected WL voltage generation circuit GEN_WL_unsel generates the non-selected word line voltage V_wl_unsel applied to the non-selected word line WL_unsel from the external power supply. The non-selected word line voltage V_wl_unsel is a voltage between the selected bit line voltage V_bl_sel and the selected word line voltage V_wl_sel, and is, for example, V_bl_sel/2. The non-selected word line voltage V_wl_unsel is preferably substantially equal to the non-selected bit line voltage V_bl_unsel. However, the non-selected word line voltage V_wl_unsel may also be different from the non-selected bit line voltage V_bl_unsel. The non-selected word line path P_WL_unsel transmits the non-selected word line voltage V_wl_unsel from the multiplexer MUX_WL0 to the multiplexers MUX_WL1_1 to MUX_WLm_n. The multiplexers MUX_WL1_1 to MUX_WLm_n electrically connect the non-selected word line WL_unsel to the non-selected WL voltage generation circuit GEN_WL_unsel via the non-selected word line path P_WL_unsel, and selectively apply the non-selected word line voltage V_wl_unsel to the non-selected word line WL_unsel.

In this way, a voltage difference between the selected bit line voltage V_bl_sel and the selected word line voltage V_wl_sel is applied to a selected memory cell MC_sel connected to the selected bit line BL_sel and the selected word line WL_sel. Accordingly, data is read from the selected memory cell MC_sel, or data is written into the selected memory cell MC_sel.

The configuration of the bank BNK, the column decoder CD, and the row decoder RD is not limited to the configuration described above. For example, an aspect of the connection between each multiplexer and a respective one of the memory cell arrays MCA is not limited to the one described above. Here, an example is shown in which the bit lines BL of one layer (BL0), the word lines WL of one layer (WL0), and the memory cells of one layer are provided. However, the number of layers of the bit lines BL, the number of layers of the word lines WL, and the number of layers of the memory cells are not limited as described above. For example, the bit lines BL of another layer may form three wiring layers in total (for example, BL0, WL0, and BL1), and the memory cell may have a two-layer structure. In this case, the column decoder CD and the row decoder RD are able to drive the plurality of bit lines BL and word lines WL, respectively. The number of layers of the bit lines BL and the word lines WL may be five (for example, BL0, WL0, BL1, WL1, and BL2) in total, and the memory cells may have a four-layer structure. In this case, although the column decoder CD and the row decoder RD are also able to drive the plurality of bit lines BL and word lines WL, respectively, any one (for example, the bit line BL) of the bit line BL and the word line WL may be independently driven in units of an odd number layer (for example, BL0 and BL2) and an even number layer (for example, BL1).

Figure 3A:
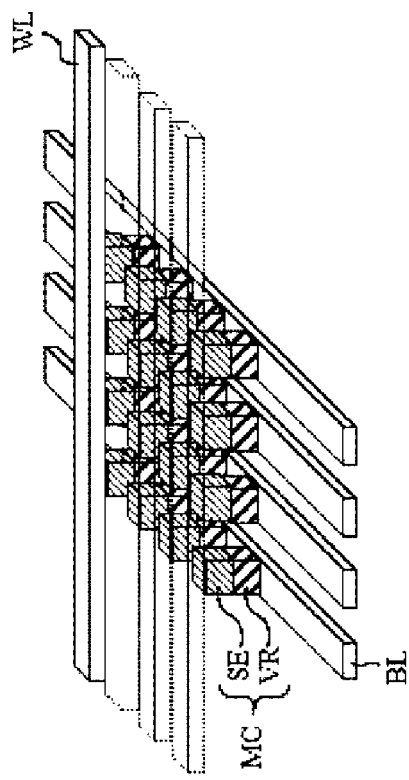

FIGS. 3A and 3B are schematic diagrams showing the memory cell array MCA according to the embodiment.

FIG. 3A is a perspective view schematically showing the memory cells MC, the bit lines BL, and the word lines WL that are provided in the memory cell array MCA.

As shown in FIG. 3A, for example, a plurality of bit lines BL having a particular interval therebetween extend in a same direction, and above the bit lines, a plurality of word lines WL having a particular interval therebetween extend in a direction that is, for example, orthogonal to the direction in which the bit lines BL extend. Each of a plurality of memory cells MC is provided at a respective one of intersecting points of the plurality of bit lines BL and the plurality of word lines WL. Accordingly, a cross-point type memory cell array MCA is formed, in which the plurality of memory cells MC are provided in a matrix configuration in a plan view. The bit line BL may be referred to as a first wiring or a second wiring, and the word line WL may be referred to as the second wiring (when the bit line is referred to as the first wiring) or the first wiring (when the bit line is referred to as the second wiring).

Although FIG. 3A shows an example in which the bit lines BL of one layer and the word lines WL of one layer are provided and memory cells MC of one layer is provided therebetween, the present disclosure is not limited thereto. The number of layers in which the memory cells MC are arranged may be further increased, and correspondingly, the number of layers of the bit lines BL and/or the word lines WL may be further increased. For example, a plurality of bit lines BL extending in a direction orthogonal to the direction in which the word lines WL extend may be further provided at intervals above the plurality of word lines WL in FIG. 3A, and a plurality of memory cells MC may be further provided at intersecting points of the plurality of word lines WL and the above plurality of bit lines BL. In this case, the memory cells MC of two layers and three wiring layers (layer of the bit lines BL and layer of the word lines WL) are provided.

FIG. 3B schematically shows a circuit configuration of the memory cell array MCA provided in the semiconductor storage device 3. Each memory cell MC is connected between one corresponding word line WL and one corresponding bit line BL. The memory cell MC includes a variable resistance element VR and a switch element SE.

The variable resistance element VR can be in a low resistance state or a high resistance state. The variable resistance element VR stores one bit of data, that is, a first value and a second value, using a difference in resistance state between the low resistance state and the high resistance state. The low resistance state may correspond to the first value and the high resistance state may correspond to the second value, or the low resistance state may correspond to the second value and the high resistance state may correspond to the first value.

The switch element SE is in the high resistance state (e.g., a non-conductive state which is an off state) when the applied voltage is less than a threshold value, and is in the low resistance state (e.g., a conductive state which is an on state) when the applied voltage is equal to or higher than the threshold value. Accordingly, the switch element SE functions as a rectifying element having a rectifying function. The switch element SE may be a bidirectional rectifying element.

Figure 4:
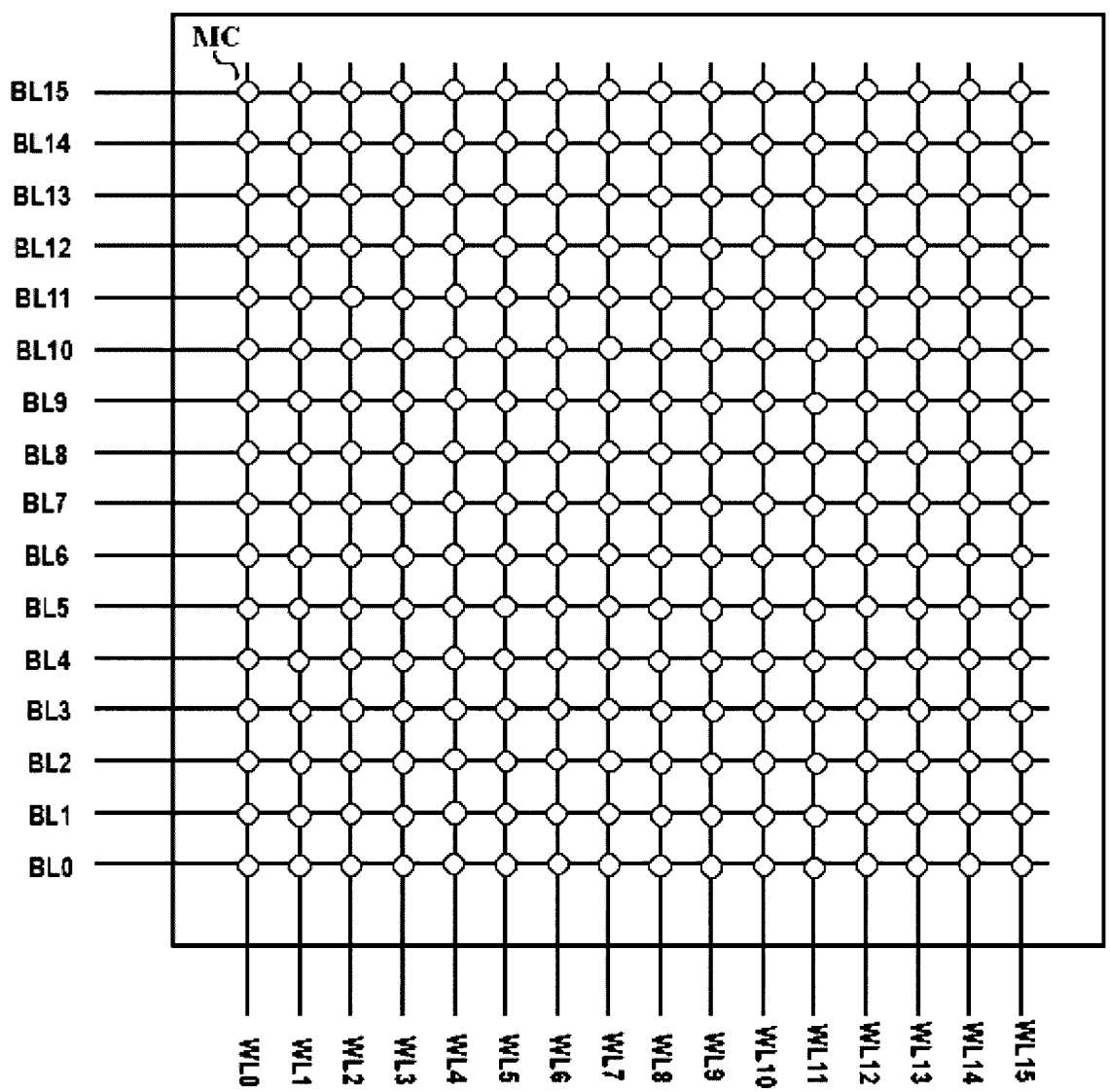
FIG. 4 is a schematic diagram showing a connection relationship among the memory cell array, bit lines, and word lines according to the embodiment.

FIG. 4 is a schematic diagram showing a connection relationship between the bit lines BL and the word lines WL with respect to the memory cell array MCA provided in the semiconductor storage device 3 according to the embodiment. For example, 16 bit lines BL and 16 word lines are connected in the memory cell array MCA. Although FIG. 4 shows an example in which a total number of each of the bit lines BL and the word lines WL is 16, the total number of each of the bit lines BL and the word lines WL is not limited thereto. For example, the total number of each of the bit lines BL and the word lines WL may be, for example, 32, 64, and 1024. Further, a plurality of memory cell arrays MCA may be provided in one semiconductor storage device 3 as shown in FIGS. 1 and 2. For example, the bit lines BL may be connected to the selected BL voltage generation circuit GEN_BL_sel and the non-selected BL voltage generation circuit GEN_BL_unsel via the multiplexers MUX_BL0 and MUX_BL1_1 to MUX_BLm_n, and the word lines WL may be connected to the selected WL voltage generation circuit GEN_WL_sel and the non-selected WL voltage generation circuit GEN_WL_unsel via the multiplexers MUX_WL0 and MUX_WL1_1 to MUX_WLm_n.

Figure 5:
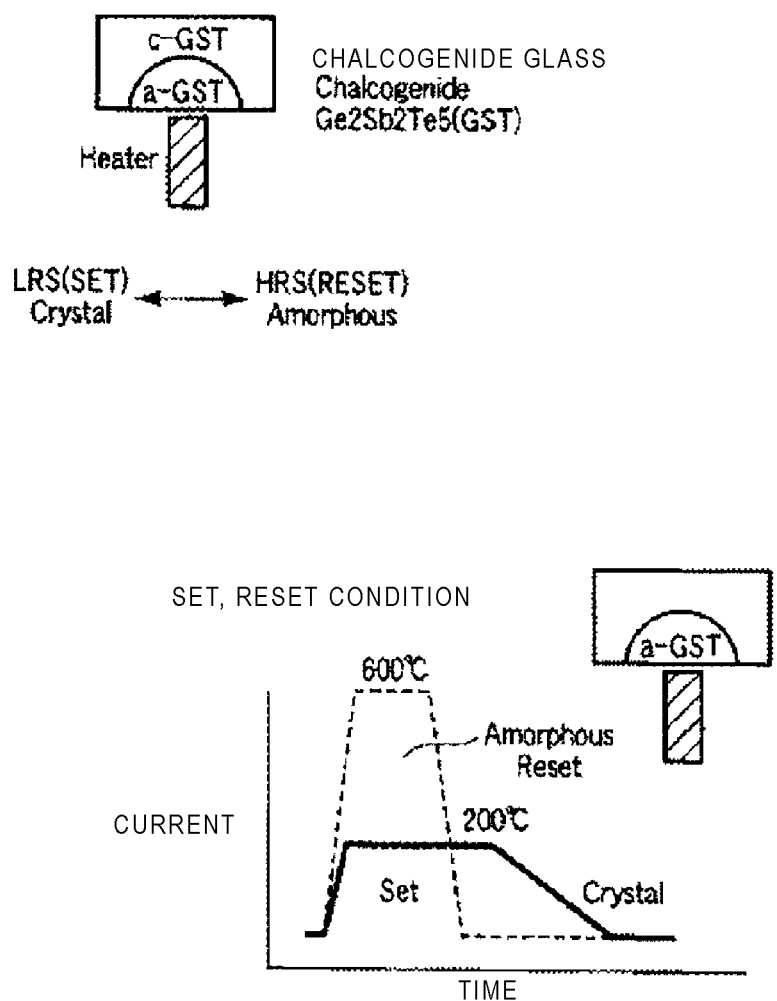
FIG. 5 is a schematic diagram schematically showing an operation of a variable resistance element according to the embodiment.

FIG. 5 schematically shows an operation of the variable resistance element VR according to the embodiment. In the embodiment, the variable resistance element VR contains, for example, a chalcogenide glass (GST: $Ge_2Sb_2Te_5$). An electrode provided adjacent to the variable resistance element VR functions as a heater to generate heat when a current flows between the bit lines BL and the word lines WL. The heat can cause the chalcogenide glass to melt and undergo a state transition. For example, the chalcogenide glass goes into an amorphous state (referred to as a reset operation) when melted at a high temperature (caused by, e.g., a high current) and then cooled rapidly (by, e.g., stopping the current), and is crystallized (referred to as a set operation) when melted at a relatively low temperature (caused by, e.g., a low current) and/or cooled slowly (e.g., reducing the current gradually). Accordingly, at a time of reading, one bit of information is determined depending on whether the current flowing between the bit lines BL and the word lines WL is large (e.g., when the variable resistance element VR in in the low resistance state=crystal state) or small (e.g., when the variable resistance element VR in in the high resistance state=amorphous state). For example, the low resistance state may be assigned with "1 data", and the high resistance state may be assigned with "0 data". Definitions of "1 data" and "0 data" is changeable. Although a cell configuration using chalcogenide glass is shown here, the material used in the embodiment is not limited to the chalcogenide glass.

Figure 6A:
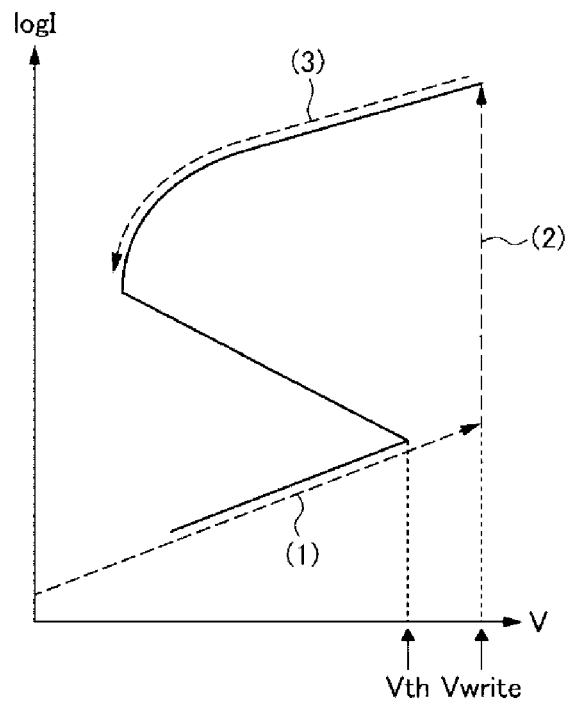
FIGS. 6A and 6B are schematic diagrams showing voltages applied to a memory cell when writing is performed on the memory cell according to a comparative example.
Figure 6B:
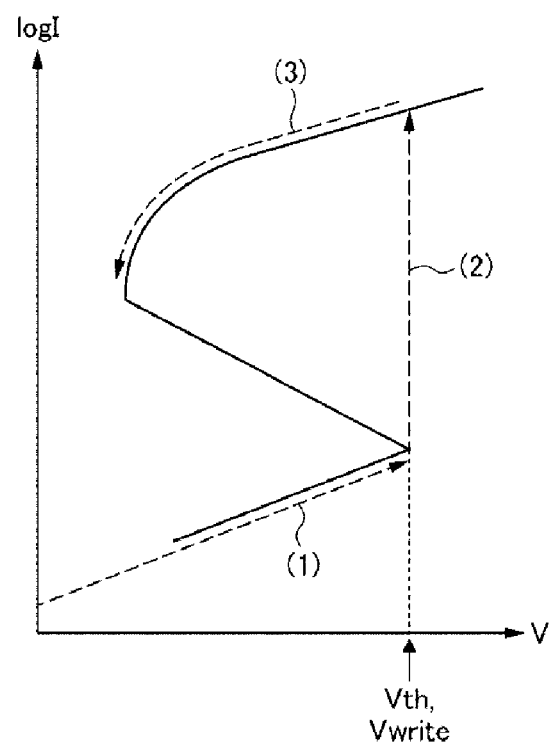

FIGS. 6A and 6B are schematic diagrams showing a voltage applied to a memory cell when writing is performed on the memory cell according to a comparative example. In FIGS. 6A and 6B, current-voltage curves when writing is performed on the memory cell according to the comparative example are indicated by solid lines. During the write operation, a predetermined write voltage Vwrite equal to or higher than a threshold voltage Vth is applied to the memory cell. That is, the voltage V_bl_sel is applied to the selected bit line BL and the voltage V_wl_sel is applied to the selected word line WL, so that a voltage difference therebetween is the predetermined write voltage Vwrite. Here, the threshold voltage Vth of each memory cell has a predetermined variation based on several factors: a characteristic variation of each memory cell, a time period elapsed from the previous writing, a temperature at which the writing is performed, and other factors. Therefore, when writing is performed in the comparative example, as shown in FIG. 6A, a write voltage Vwrite higher than the threshold voltage Vth is applied to the memory cell in consideration of the predetermined variation. At this time, a current (a memory cell current) flowing through the memory cell increases as the applied voltage increases as in a current-voltage curve part indicated by a broken line arrow (1) in FIG. 6A. Next, the memory cell voltage reaches the predetermined write voltage Vwrite and the memory cell current increases more rapidly, for example, as in a current-voltage curve part indicated by a broken line arrow (2) in FIG. 6A. This phenomenon in which the current rapidly increases is referred to as a snapback. The threshold voltage Vth according to the embodiment is a voltage at which this snapback occurs, and is also referred to as a snapback voltage. Thereafter, the memory cell current and the memory cell voltage decrease, for example, as indicated by a broken line arrow (3) in FIG. 6A. A degree of the decrease may be different depending on characteristics of the memory cell, shapes of the word line WL and the bit line BL that are connected to the memory cell, and the like.

In the comparative example shown in FIG. 6A, the write voltage Vwrite is higher than the threshold voltage Vth. Therefore, a larger amount of current flows momentarily in the memory cell as compared with a case where writing is performed at the threshold voltage Vth. This may result in a higher stress to the memory cell as compared with the case where the write voltage Vwrite is set to be equal to the voltage Vth (theoretical minimum value). Therefore, reliability may be affected by the stress applied to the memory cell.

On the other hand, as shown in FIG. 6B, if the predetermined write voltage Vwrite can be matched with the threshold voltage Vth, the larger amount of current flow can be prevented.

Figure 7A:
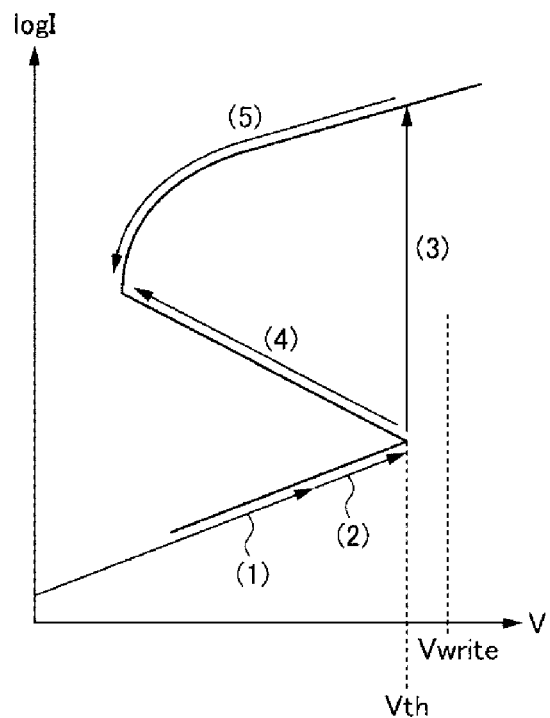
FIGS. 7A and 7B are schematic diagrams showing writing performed on a memory cell according to the embodiment.
Figure 7B:
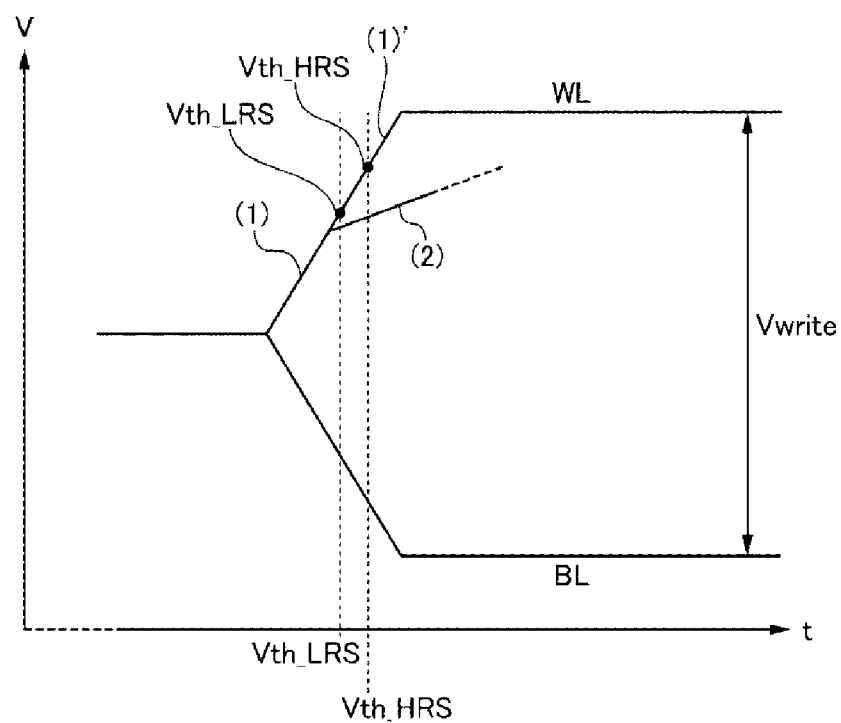

FIGS. 7A and 7B are schematic diagrams showing writing performed on a memory cell according to the embodiment. In FIG. 7A, a current-voltage curve when writing is performed on the memory cell according to the embodiment is indicated by a solid line. Here, a voltage to be applied to the memory cell increases as in a current-voltage curve part indicated by a solid line arrow (1). Thereafter, the voltage gradually increases over time in a current-voltage curve part indicated by a solid line arrow (2), which is different from the case in FIGS. 6A and 6B. Then, when the voltage to be applied to the memory cell reaches the threshold voltage Vth, the memory cell current rapidly increases as in a current-voltage curve part indicated by a solid line arrow (3), and then the memory cell current and the voltage applied to the memory cell decrease as in a current-voltage curve part indicated by a solid line arrow (5). When the voltage to be applied to the memory cell reaches the threshold voltage Vth, the memory cell current may increase and the voltage applied to the memory cell may decrease as in a current-voltage curve part indicated by a solid line arrow (4). Further, an intermediate characteristic between those indicated by the solid line arrow (3) and the solid line arrow (4) may appear. In any case, in the case shown in FIG. 7A, the voltage is gradually increased over time as in the current-voltage curve part indicated by the solid line arrow (2).

FIG. 7B shows an example of a method of applying a voltage to the word line WL and the bit line BL when writing is performed on the memory cell according to the embodiment. A vertical axis represents the voltage V to be applied to the word line WL (the selected word line) and the bit line BL (the selected bit line), and a horizontal axis represents a time period t. The voltage V to be applied to the memory cell is represented by, for example, a voltage difference between the voltage to be applied to the word line WL and the voltage to be applied to the bit line BL. In the case according to the comparative example shown in FIGS. 6A and 6B, the voltage V to be applied to the word line WL increases constantly over time as shown in (1) and (1)' in FIG. 7B. The voltage V to be applied to the bit line BL decreases over time. Thereafter, the voltage V to be applied to the word line WL and the voltage V to be applied to the bit line BL are set to change constantly. On the other hand, in the case shown in FIG. 7A, the voltage V to be applied to the word line WL increases with, for example, a first slope as (1) in FIG. 7B. Thereafter, for example, as shown in (2) in FIG. 7B, the rate of increasing voltage V is set to be more gradual, for example, the voltage V increases with a second slope smaller than the first slope. Accordingly, it is not necessary to increase the voltage to be applied to the memory cell to the write voltage Vwrite, and writing can be performed by causing a snapback at a lower voltage (the threshold voltage Vth which is lower than the write voltage Vwrite). Accordingly, a more reliable semiconductor storage device and the control method thereof can be provided.

The threshold voltage Vth may be different depending on whether the variable resistance element VR and the switch element SE of the memory cell MC are in the high resistance state (HRS) or in the low resistance state (LRS). Here, when the threshold voltage Vth in the high resistance state and the low resistance state is Vth_LRS and Vth_HRS, respectively, a voltage range for increasing the memory cell voltage with the second slope is preferably from a voltage lower than Vth_LRS to a voltage higher than Vth_HRS. Accordingly, the reliability of the memory cell is increased by causing a snapback at a voltage lower than the write voltage Vwrite regardless of whether the memory cell is in the high resistance state or in the low resistance state. Vth_LRS may be higher than Vth_HRS depending on the characteristics of the memory cell. In such a case, for example, a voltage range for increasing the memory cell voltage with the second slope is preferably from a voltage lower than Vth_HRS to a voltage higher than Vth_LRS.

Figure 8A:
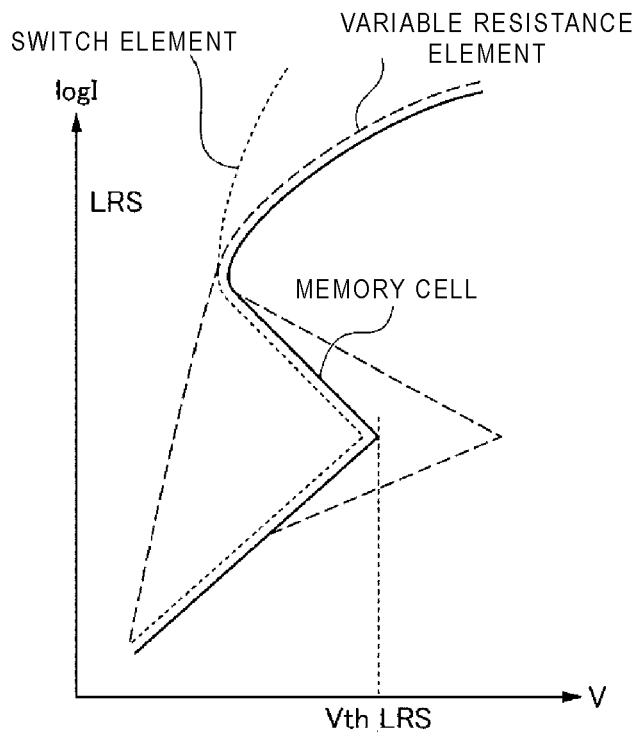
FIGS. 8A and 8B are schematic diagrams showing current-voltage characteristics of the memory cell at a time of reading according to the embodiment.
Figure 8B:
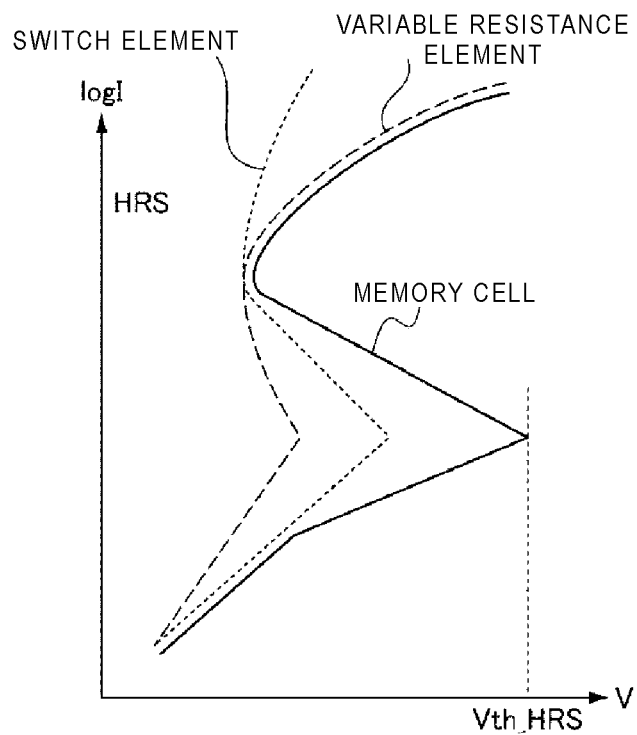

FIGS. 8A and 8B are schematic diagrams showing current-voltage characteristics of the memory cell at a time of reading according to the embodiment. FIG. 8A shows the current-voltage characteristic of the low resistance state (LRS), and FIG. 8B shows the current-voltage characteristic of the high resistance state (HRS). As shown in FIGS. 8A and 8B, the current-voltage characteristics of the low-resistance state and the high-resistance state are different. For example, the read threshold voltage Vth_LRS in the low resistance state is lower than the threshold voltage Vth_HRS in the high resistance state.

Figure 9A:
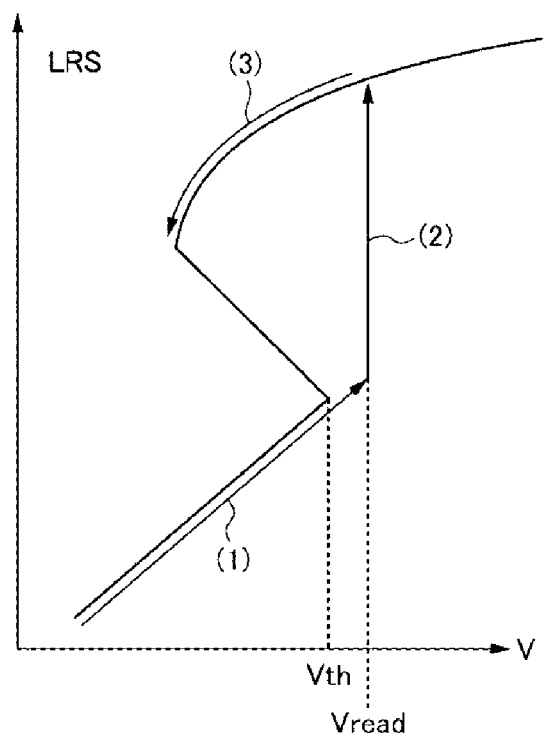
FIGS. 9A and 9B are schematic diagrams showing a read disturb occurring in the memory cell when reading is performed on the memory cell according to the comparative example.
Figure 9B:
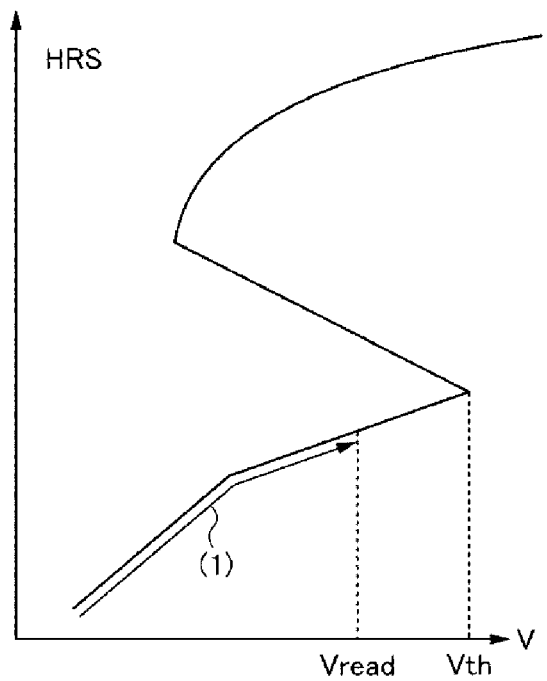

FIGS. 9A and 9B are schematic diagrams showing a read disturb occurring when reading is performed on the memory cell according to the comparative example. FIG. 9A shows the current-voltage characteristic of the low resistance state (LRS), and FIG. 9B shows the current-voltage characteristic of the high resistance state (HRS).

When reading is performed on the memory cell in the low resistance state, as shown in FIG. 9A, the read voltage Vread which is higher than the threshold voltage Vth in the low resistance state is applied to the memory cell MC. First, a voltage to be applied to the memory cell is increased as in a current-voltage curve part indicated by a solid line arrow (1) in FIG. 9A. Thereafter, when the voltage to be applied to the memory cell is further increased and the read voltage Vread is applied, the memory cell current rapidly increases and a so-called snapback occurs as in a current-voltage curve part indicated by a solid line arrow (2), and then the memory cell current and the memory cell voltage decrease as in a current-voltage curve part indicated by a solid line arrow (3). The current-voltage curve part indicated by the solid line arrow (3) may become steadier halfway.

When the memory cell in the high resistance state is read, as shown in FIG. 9B, the read voltage Vread which is lower than the threshold voltage Vth in the high resistance state is applied to the memory cell MC. Then, as indicated by a solid line arrow (1) in FIG. 9B, after the voltage applied to the memory cell increases, the memory cell current becomes steadier at a certain value. The so-called snapback does not occur.

As shown in FIGS. 9A and 9B, it is preferable to set the read voltage Vread to a voltage larger than the threshold voltage Vth in the low resistance state and smaller than the threshold voltage Vth in the high resistance state. In order to perform reading with a margin, in other words, in order to maximize a read margin, it is preferable that the threshold voltage Vth in the low resistance state is a voltage exceeding a maximum value with a certain degree of margin for the threshold voltage Vth in the low resistance state of each cell. In order to perform reading with the margin, in other words, in order to maximize the read margin, it is preferable that the threshold voltage Vth in the high resistance state is a voltage below a minimum value with a certain degree of margin for the threshold voltage Vth in the high resistance state of each cell.

For example, the low resistance state may be assigned "1 data", and the high resistance state may be assigned "0 data". To determine whether or not the memory cell holds "1 data" or "1 data", a voltage Vread, which is higher than the threshold voltage Vth in the low resistance state, is applied to the memory cell. Similarly to the threshold voltage Vth in the high resistance state, the threshold voltage Vth in the low resistance state generally varies depending on individual memory cells. Therefore, to stably operate the memory cells, the voltage Vread may be set to be higher than the threshold voltage Vth in the low resistance state.

Theoretically, it is sufficient to apply the threshold voltage Vth in the low resistance state for determining whether or not the memory cell is in the low resistance state, because the threshold voltage Vth in the low resistance state is a minimum voltage for generating the snapback of the memory cell. However, it is difficult to know previously and precisely what the threshold voltage Vth is in the low resistance state when read operation is performed on the memory cell. Therefore, in practice, Vread may be set higher than the threshold voltage Vth in the low resistance state. This may result in higher power consumption of the memory cell, and in unintentional destruction of data recorded (stored) in the memory cell.

Figure 10A:
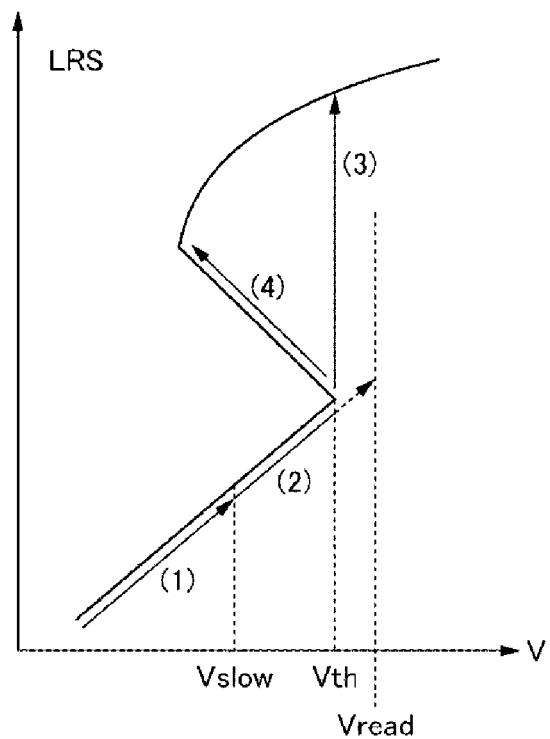
FIGS. 10A and 10B are schematic diagrams showing reading performed on the memory cell according to the embodiment.
Figure 10B:
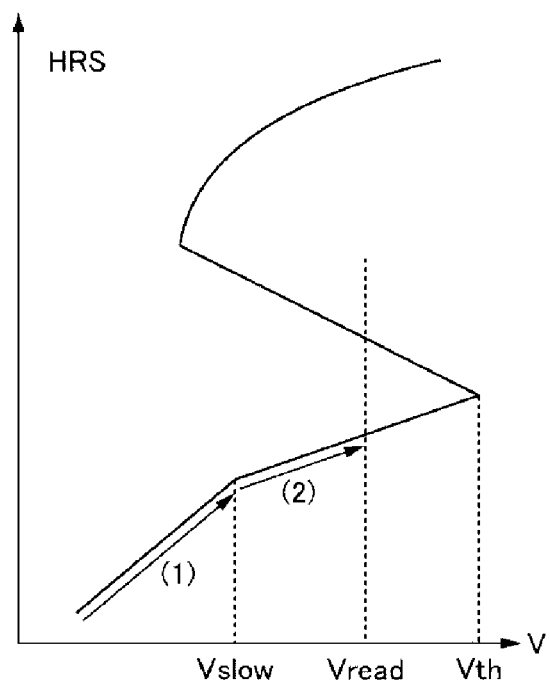

FIGS. 10A and 10B are schematic diagrams showing reading performed on the memory cell according to the embodiment. In FIG. 10A, a current-voltage curve when writing is performed on the memory cells according to the embodiment in the low resistance state is indicated by a solid line. Here, a voltage to be applied to the memory cell is increased with the first slope, for example, as in a current-voltage curve part indicated by a solid line arrow (1). Thereafter, the voltage is more gradually increased over time with the second slope, for example, to Vread in a current-voltage curve part indicated by a solid line arrow (2), which is different from the case according to the comparative example shown in FIGS. 9A and 9B. Then, when the memory cell voltage reaches the threshold voltage Vth, the memory cell current rapidly increases as in a current-voltage curve part indicated by a solid line arrow (3), and then the memory cell current and the memory cell voltage decrease as in a current-voltage curve part indicated by a solid line arrow (5). When the voltage to be applied to the memory cell reaches the threshold voltage Vth, the memory cell current may increase and the memory cell voltage may decrease as in a current-voltage curve part indicated by a solid line arrow (4). Further, an intermediate characteristic between those indicated by the solid line arrow (3) and the solid line arrow (4) may appear. In any case, the voltage is gradually increased over time in the current-voltage curve part indicated by the solid line arrow (2). In this way, the voltage to be applied to the memory cell can decrease from Vread to Vth. It is also considered that the current accompanying the snapback when the threshold voltage Vth is applied to the memory cell is smaller than the current accompanying the snapback when Vread is applied to the memory cell. Therefore, a rapid increase in current accompanying the snapback can be prevented. Accordingly, a more reliable semiconductor storage device and the control method thereof can be provided.

In FIG. 10B, a current-voltage curve when writing is performed on the memory cells according to the embodiment in the high resistance state is indicated by a solid line. A voltage to be applied to the memory cell increases with the first slope, for example, as in a current-voltage curve part indicated by a solid line arrow (1). Thereafter, the voltage is more gradually increased over time with the second slope, for example, to Vread in a current-voltage curve part indicated by a solid line arrow (2), which is different from the case according to the comparative example shown in FIGS. 9A and 9B. When the voltage reaches Vread, the increase in the voltage stops. The snapback does not occur.

Vwrite and Vread described above also increase after the snapback occurs. However, when a current flows through the memory cell, an IR drop due to a resistance of the word line WL and a resistance of the bit line BL occurs. Therefore, in general, the memory cell current becomes smaller than a current immediately after the snapback occurs.

For example, it is preferable to detect an increase in the memory cell current accompanying the snapback using an ammeter or the like provided in the peripheral circuit PC shown in FIG. 1 during writing and reading. Then, when a snapback occurs, it is preferable to stop the increase in the applied voltage by the voltage generation circuit GEN shown in FIG. 2.

The methods of performing reading and writing on the memory cell described above is an example of a method of controlling the memory cell.

FIGS. 11A, 11B, 11C, 11D, and 11E are schematic diagrams showing an example of changes in voltages to be applied to the word line WL and the bit line BL that are connected to the memory cell when reading and writing is performed on the memory cell according to the embodiment. The memory cell voltage corresponds to a voltage difference between the voltage applied to the word line WL and the voltage applied to the bit line BL. The voltage applied to the word line WL and the voltage applied to the bit line BL are voltages to be applied from outside the memory cell array MCA using, for example, the voltage generation circuit GEN shown in FIG. 2. The word line WL and the bit line BL may be interchanged in the drawings described below. Since a voltage to be applied to a cell is expressed in a form of a voltage difference between the WL voltage and the BL voltage, as long as the voltage difference is equivalent, equivalent write or read operation is performed on the memory cell even if waveforms of WL and BL are different from those exemplified.

Figure 11A:
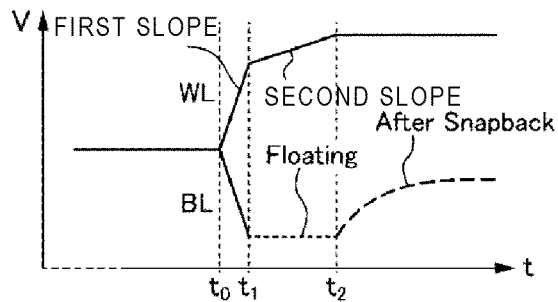
FIGS. 11A, 11B, 11C, 11D, and 11E show an example of changes in a voltage applied to a word line WL and a bit line BL in methods of reading and writing performed on the memory cell according to the embodiment.

In FIG. 11A, before a time point t0, the voltage to be applied to the word line WL and the voltage to be applied to the bit line BL are set to be equal to VSS, for example. VSS is, for example, zero volt (0V), but is not limited thereto. Next, after the time point t0, the voltage applied to the word line WL is increased with the first slope. On the other hand, the voltage (an example of a predetermined voltage) applied to the bit line BL is decreased. Next, after a time point t1, the voltage applied to the word line WL is further increased with the second slope which is smaller than the first slope. On the other hand, after the time point t1, the bit line BL is placed in an electrically floating state. The bit line BL is placed in an electrically floating state, for example, to prevent a current exceeding a desired range from flowing through the memory cell. Then, for example, when the snapback occurs at a time point t2, the voltage increase of the word line WL is stopped. The voltage of the bit line BL gradually increases over time since the memory cell voltage after the snapback occurs is gradually decreased. The amount of increase varies depending on, for example, a capacitance of the bit line BL.

Figure 11B:
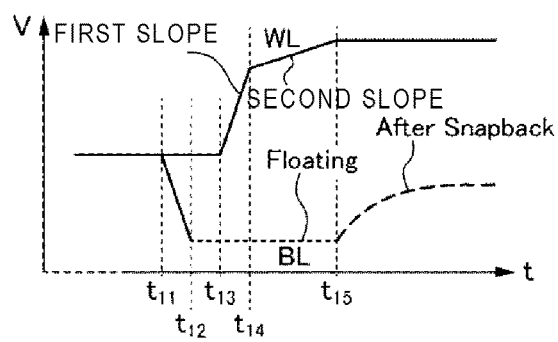

In FIG. 11B, before a time point t11, the voltage applied to the word line WL and the voltage applied to the bit line BL are set equal to VSS, for example. Next, at the time point t11, the voltage of the bit line BL is decreased. Next, at a time point t12, the bit line BL is placed in an electrically floating state. Thereafter, at a time point t13, the voltage of the word line WL is increased with the first slope. Thereafter, at a time point t14, the voltage of the word line WL is further increased with the second slope which is smaller than the first slope. Then, for example, when the snapback occurs at a time point t15, the voltage increase of the word line WL is stopped. The voltage of the bit line BL gradually increases over time since the memory cell voltage after the snapback occurs is gradually decreased. The amount of the increase varies depending on, for example, the capacitance of the bit line BL. In the control shown in FIG. 11B, the voltage of the bit line BL is controlled (reduced) and the bit line BL is placed in an electrically floating state, and then the voltage of the word line WL is controlled. The control can be facilitated since a time period for controlling the bit line BL and a time period for controlling the word line WL are separated.

Figure 11C:
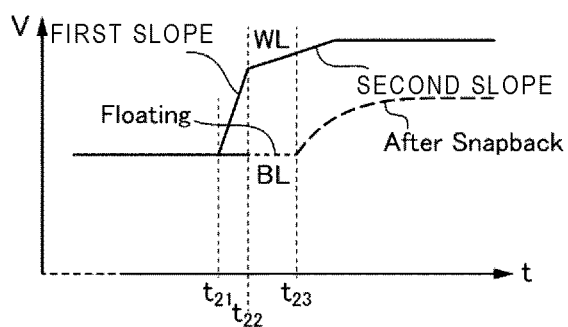

In FIG. 11C, before a time point t21, the voltage applied to the word line WL and the voltage applied to the bit line BL are set equal to VSS, for example. Next, for the word line WL, at t21, the voltage of the word line WL is increased with the first slope. Thereafter, at t22, the voltage of the word line WL is further increased with the second slope which is smaller than the first slope. The bit line BL is placed in an electrically floating state between t21 and t22. The control shown in FIG. 11C is simpler, because the bit line BL is set to be in an electrically floating state without changing the voltage thereof. However, VSS, for example, is applied to the bit line BL before the time point t21 since it is preferable to apply a certain voltage to the bit line BL.

Figure 11D:
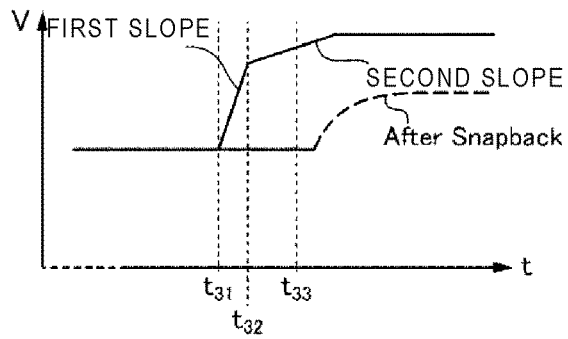

FIG. 11D shows an example of a change in the memory cell voltage over time. The slope of voltage increase of the word line WL at t32 is set to the second slope from the first slope before the bit line BL is placed in an electrically floating state after a time point t33.

Figure 11E:
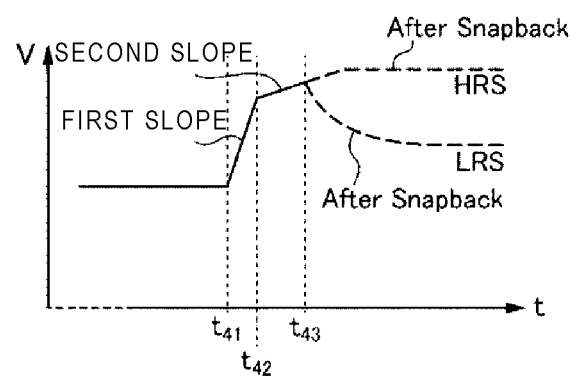

FIG. 11E shows an example of a change in the memory cell voltage over time. The memory cell voltage is a predetermined voltage (for example, 0 volt) before a time point t41, and increases with the first slope after the time point t41. Next, after a time point t42, the memory cell voltage further increases with the second slope. When the snapback occurs, the voltage behavior in the low resistance state (LRS) is different from the voltage behavior in the high resistance state (HRS), and a higher voltage is applied to the memory cell in the case of the high resistance state.

Figure 12:
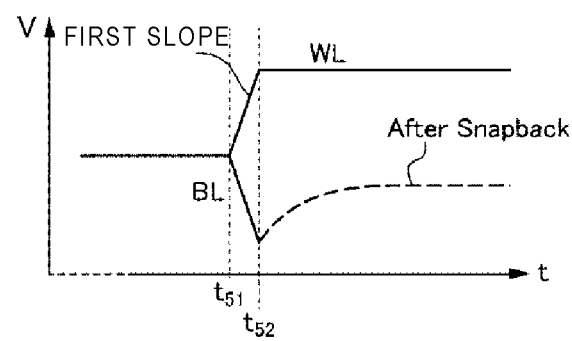
FIG. 12 shows an example of changes in a voltage applied to a word line WL and a bit line BL in methods of performing reading and writing on the memory cell according to the comparative example.

FIG. 12 shows an example of changes in the voltage applied to the word line WL and the bit line BL in methods of performing reading and writing on the memory cell according to the comparative example. After a time point t51, the voltage applied to the word line WL is increased with the first slope. The voltage applied to the bit line BL is decreased at a constant rate after the time point t51. FIG. 12 also shows a case where a snapback occurs at a time point t52, and the voltage of the word line WL after the time point t52 is kept constant. In the embodiment, a more reliable semiconductor storage device and the control method thereof can be provided since, in the methods of performing reading and writing on the memory cell according to the embodiment, the voltage of the word line is changed with the first slope and the second slope as described above.

Figure 13:
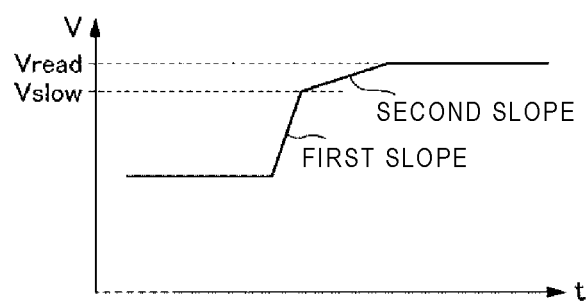
FIG. 13 is a schematic diagram showing a voltage level at which the slope of the voltage increase is decreased in the methods of reading and writing performed on the memory cell according to the embodiment.

FIG. 13 is a schematic diagram showing Vslow according to the embodiment. FIG. 13 schematically shows a change in the memory cell voltage over time. Vread>Vslow. It is assumed that Vslow is lower than a voltage which is a center value in a distribution of Vth of the memory cells, that is, Vslow<(voltage which is the center value in the distribution of Vth of the memory cells). In this case, it is considered that for 50% of all the memory cells, a snapback occurs while the memory cell voltage is increased with the second slope. Therefore, for the 50% of all the memory cells, stress or read disturb caused by voltage application at the time of reading is reduced. When Vslow is set to be lower than a voltage which is a minimum value in the distribution of Vth of the memory cells, that is, Vslow<(voltage that is the minimum value in the distribution of Vth of the memory cells), for the 100% of the memory cells, stress or read disturb caused by voltage application at the time of reading is reduced. Similarly, by setting Vwrite and Vslow to have the relationship described above, the voltage stress at the time of writing can be reduced. In general, Vslow has different values at the time of reading and writing. However, Vslow may have the same value at the time of reading and writing.

Figure 14A:
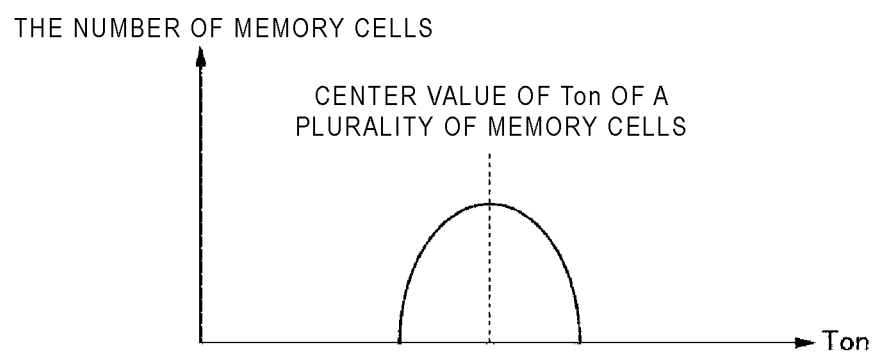
FIGS. 14A and 14B show a snapback time period of the memory cell according to the embodiment.
Figure 14B:
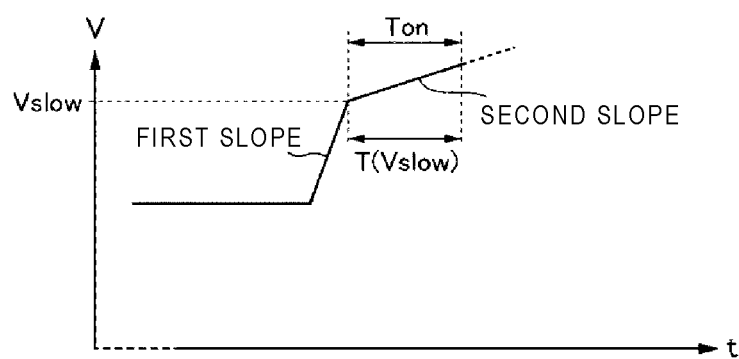

FIGS. 14A and 14B show a snapback time period Ton of the memory cell according to the embodiment. Generally, depending on a material used in the memory cell and characteristics, the snapbacks at the time of reading and writing do not necessarily occur instantaneously and in a substantially stepwise manner. That is, a snapback may occur after a certain degree of time period passes since the snapback voltage is exceeded. When the snapback occurs, the memory cell current may not increase in a substantially stepwise manner and may increase gradually. Therefore, the time period required for the snapback is referred to as the snapback time period Ton. FIG. 14A shows a distribution of the snapback time period Ton of the memory cell according to the embodiment. FIG. 14B schematically shows a change in the memory cell voltage over time, according to the embodiment. Therefore, when a time period, during which the slope of the memory cell voltage increase is the second slope, is set as T (Vslow), and for example, when T (Vslow)=(center value of Ton of the memory cells according to the embodiment), it is considered that for 50% of all the memory cells, a snapback occurs while the memory cell voltage is increasing in accordance with the second slope. Therefore, for the 50% of all the memory cells, stress or read disturb caused by the voltage at the time of writing is reduced.

Figure 15A:
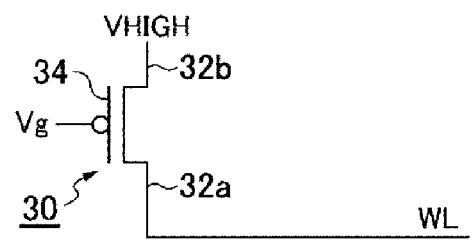
FIGS. 15A, 15B, 15C, 15D, 15E, 15F, and 15G show an example of a waveform generation circuit used in the semiconductor storage device and the control method thereof according to the embodiment.
Figure 15B:
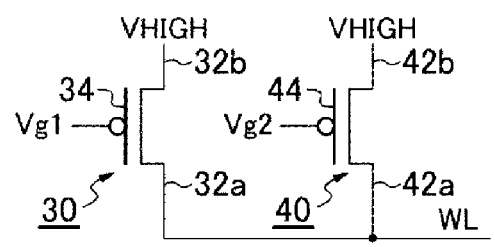
Figure 15C:
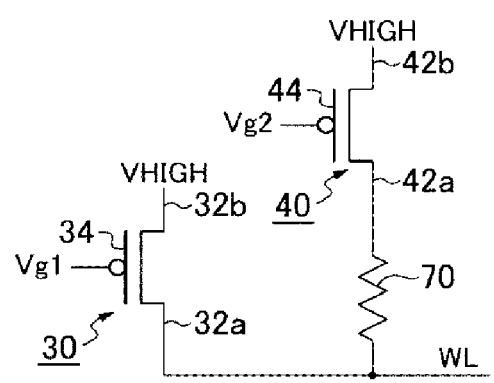
Figure 15D:
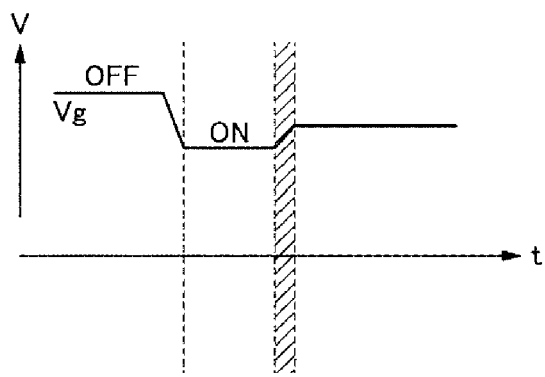

FIGS. 15A, 15B, 15C, 15D, 15E, 15F, and 15G show an example of a waveform generation circuit used in the semiconductor storage device and the control method thereof according to the embodiment. The waveform generation circuit described above is a circuit that is preferably used for applying a voltage to the memory cell according to the embodiment. FIG. 15A shows an example of the semiconductor storage device according to the embodiment. A PMOS 30 includes a first electrode 32a, a second electrode 32b, and a first control electrode 34, and the first electrode 32a is connected to the word line WL. A voltage VHIGH is applied to the second electrode 32b. FIG. 15D shows an example of a control method according to the embodiment. A change in a voltage Vg applied to the first control electrode 34 over time is shown. After the voltage Vg at which the PMOS 30 is turned off is applied, the voltage Vg is decreased to turn on the PMOS 30 in order to apply the voltage increasing with the first slope to the word line WL. Thereafter, when the manner of increasing the voltage is changed from the first slope to the second slope, the voltage applied to the first control electrode 34 is set to a voltage between the voltage at which the PMOS 30 is turned on and the voltage at which the PMOS 30 is turned off. This means, in other words, when the memory cell voltage reaches Vslow and the manner of increasing the voltage is changed from the first slope to the second slope, an ON resistance of the PMOS used as a switch is increased to stably supply a higher voltage.

Figure 15E:
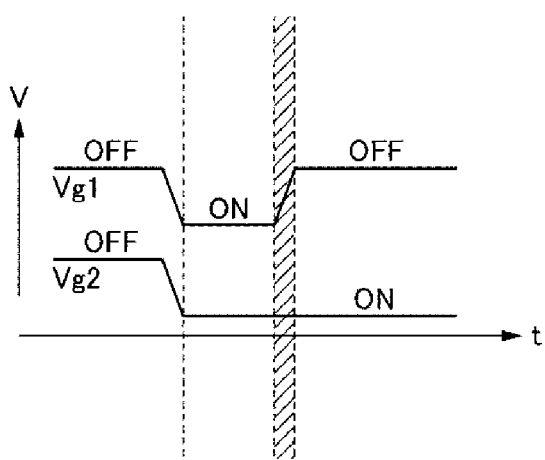
Figure 15F:
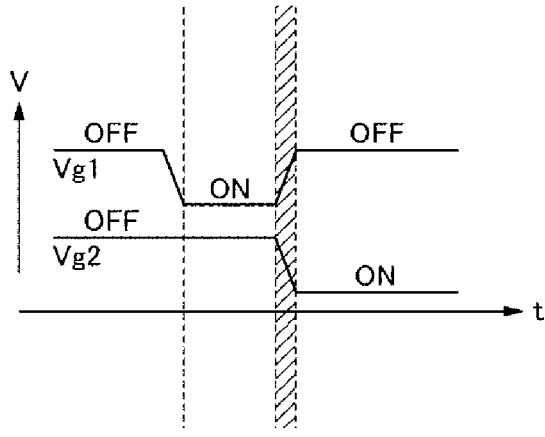
Figure 15G:
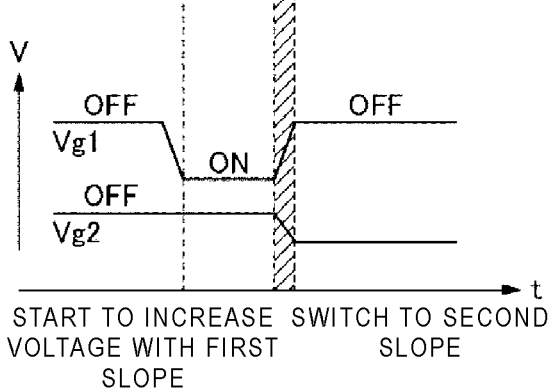

FIG. 15B shows an example of the waveform generation circuit used in the semiconductor storage device and the control method thereof according to the embodiment. Here, a PMOS 40 that includes a third electrode 42a, a fourth electrode 42b, and a second control electrode 44 is further used in addition to the PMOS 30. The third electrode 42a is connected to the word line WL. Then, VHIGH is applied to the fourth electrode 42b. FIG. 15E shows a change in voltages Vg1 and Vg2 applied to the first control electrode 34 and the second control electrode 44 over time. The first control electrode 34 of the PMOS 30 is applied with Vg1 at which the PMOS 30 is turned off and then Vg1 is decreased so that the PMOS 30 is turned on when the manner of increasing the voltage is switched to the first slope. Then, the first control electrode 34 is applied with initial Vg1 again at which the PMOS 30 is turned off when the manner of increasing the voltage is switched to the second slope. On the other hand, the second control electrode 44 of the PMOS 40 is applied with Vg2 at which the PMOS 40 is turned off before the manner of increasing the voltage is switched to the first slope, and then Vg2 is decreased so that the PMOS 40 is turned on when the manner of increasing the voltage is switched to the first slope. Then, when the manner of increasing the voltage is switched to the second slope, Vg2 is maintained at the low level at which the PMOS 40 is turned on. In this way, in FIG. 15B, a plurality of switches are provided for applying the voltages to the word line WL. Then, when the manner of increasing the voltage is switched from the first slope to the second slope, the number of PMOS switches that are turned on is reduced from two (PMOS 30 and PMOS 40) to one (PMOS 40). FIG. 15F shows another example of the change in voltages Vg1 and Vg2 applied to the first control electrode 34 and the second control electrode 44 over time. Although Vg1 is similar to that of FIG. 15E, for Vg2, the voltage level of Vg2 at which the PMOS 40 is turned off is applied until the manner of increasing the voltage is switched to the second slope, and the voltage level of Vg2 at which the PMOS 40 is turned on is applied when the manner of increasing the voltage is switched to the second slope. For example, it is considered to use a PMOS 40 which is smaller than the PMOS 30 and has a high ON resistance. Then, when the memory cell voltage reaches Vslow and the manner of increasing the voltage is switched from the first slope to the second slope, the switch to be used is switched from a switch having the low ON resistance to a switch having the high ON resistance.

As a method of achieving the high ON resistance, a method using a MOSFET having a high ON resistance, a method using a MOSFET having a small gate-source voltage (Vgs), and other methods using a type of MOSFET having a high ON resistance are preferable since W/L, which is a ratio of a channel width W and a channel length L of the MOSFET, is small. As shown in FIG. 15C, a method of connecting the third electrode 42a and the word line WL via a resistance is also preferable since the PMOS 40 along with the resistance 70 is substantially a transistor having a high ON resistance.

Figure 16A:
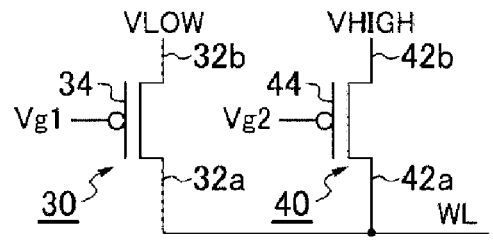
FIGS. 16A and 16B show another example of the waveform generation circuit used in the semiconductor storage device and the control method thereof according to the embodiment.
Figure 16B:
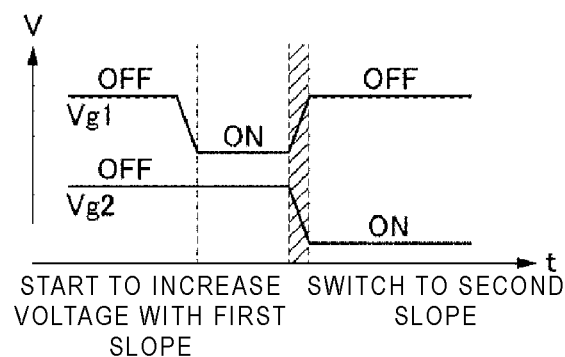

FIGS. 16A and 16B show another example of the waveform generation circuit used in the semiconductor storage device and the control method thereof according to the embodiment. Here, as shown in FIG. 16A, VLOW is applied to the second electrode 32b of the PMOS 30, and VHIGH which is higher than VLOW is applied to the fourth electrode 42b of the PMOS 40. Then, as shown in FIG. 16B, when the voltage in the first slope is applied, the PMOS 30 to which the relatively low voltage VLOW is applied is turned on. Thereafter, when the manner of increasing the voltage is switched from the first slope to the second slope, the PMOS 30 is turned off and the PMOS 40 to which a relatively high voltage VHIGH is applied is turned on.

The control of the voltage to be applied to the waveform generation circuit, the first control electrode 34, and the second control electrode 44, a method of connecting a source voltage, the method of switching the PMOS 30 and the PMOS 40, and the like shown in FIGS. 15A, 15B, 15C, 15D, 15E, 15F, 15G, 16A and 16B may be appropriately combined.

Figure 17:
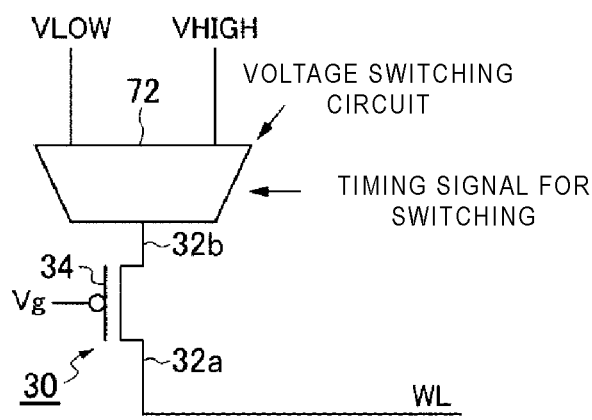
FIG. 17 shows another example of the waveform generation circuit used in the semiconductor storage device and the control method thereof according to the embodiment.

FIG. 17 is another example of the waveform generation circuit used in the semiconductor storage device and the control method thereof according to the embodiment. Here, a voltage switching circuit 72 is connected to the second electrode 32b of the PMOS 30. Then, the voltage switching circuit 72 can perform control by, for example, inputting a timing signal for switching VLOW and VHIGH as shown in FIGS. 16A and 16B.

Figure 18:
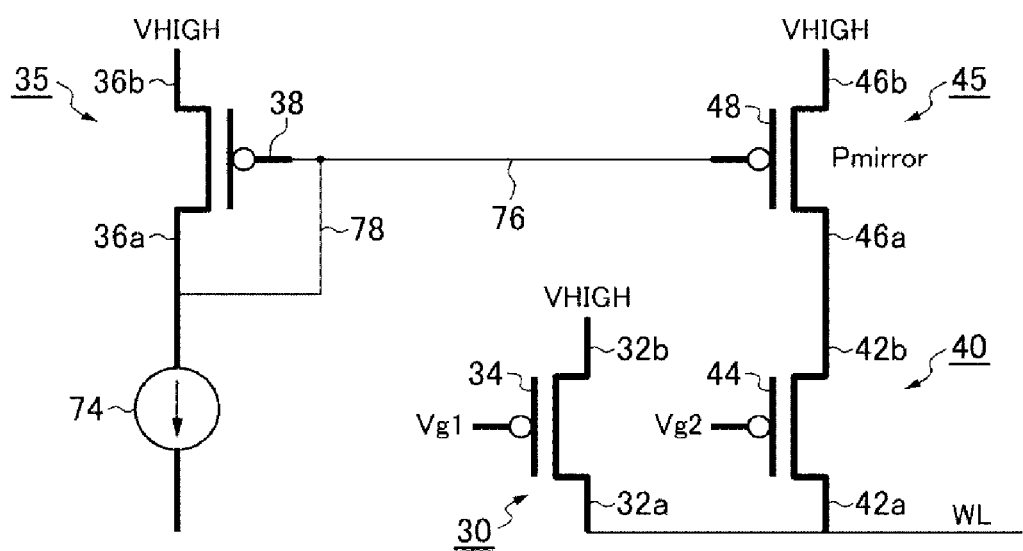
FIG. 18 shows another example of the waveform generation circuit used in the semiconductor storage device and the control method thereof according to the embodiment.

FIG. 18 shows another example of the waveform generation circuit used in the semiconductor storage device and the control method thereof according to the embodiment. Here, a PMOS 45 (Pmirror) includes a fifth electrode 46a, a sixth electrode 46b, and a third control electrode 48, and the fifth electrode 46a is connected to the fourth electrode 42b. A PMOS 35 includes a seventh electrode 36a, an eighth electrode 36b, and a fourth control electrode 38, and the fourth control electrode 38 and the third control electrode 48 are connected by a wiring 76. The seventh electrode 36a and the wiring 76 are connected by a wiring 78. VHIGH is applied to the eighth electrode 36b. A current source 74 is connected to the seventh electrode 36a.

The waveform generation circuit shown in FIG. 18 is a so-called current mirror circuit. In the waveform generation circuit shown in FIG. 18, the PMOS 45 (Pmirror) functioning as a switch and a current source is connected in series to the waveform generation circuit shown in FIG. 15B. A gate voltage (a voltage input to the third control electrode 48) of the PMOS 45 is controlled by, for example, the PMOS 35 and the current source 74. Accordingly, when a voltage is supplied to the word line WL by the PMOS 45 and the PMOS 40, the current is regulated by the PMOS 45. At this time, the slope of the voltage is represented by a formula CWL/Imirror based on a word line capacitance CWL and a current Imirror defined by the PMOS 45. Accordingly, a voltage waveform can be controlled with high accuracy. When the voltage to be applied to the second electrode 32b is VLOW, the voltage that is switched between the first slope and the second slope can be controlled with higher accuracy.

Figure 19A:
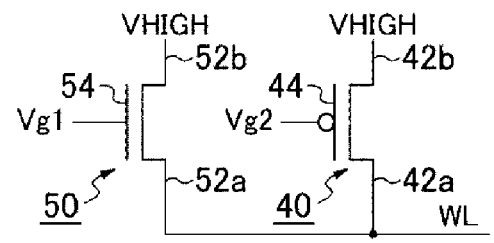
FIGS. 19A, 19B, and 19C show another example of the waveform generation circuit used in the semiconductor storage device and the control method thereof according to the embodiment.
Figure 19B:
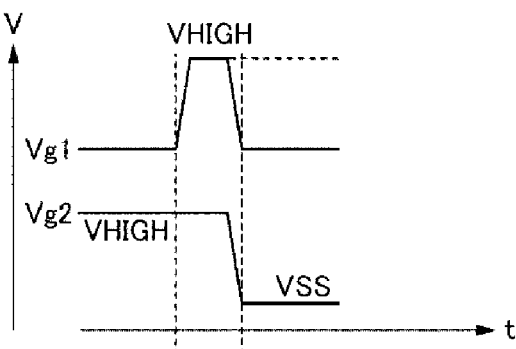
Figure 19C:
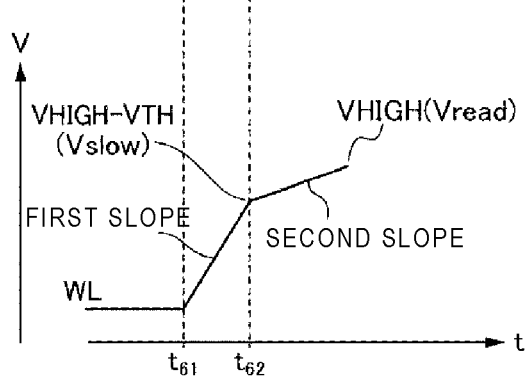

FIGS. 19A, 19B, and 19C show another example of the waveform generation circuit used in the semiconductor storage device and the control method thereof according to the embodiment. Here, as shown in FIG. 19A, an NMOS 50 including a ninth electrode 52a, a tenth electrode 52b, and a fifth control electrode 54 is provided instead of the PMOS shown in FIG. 15B. The word line WL and the ninth electrode 52a are connected.

When the waveform is generated, first, as shown in FIG. 19B, at a time point t61, the voltage Vg1 to be applied to the fifth control electrode 54 is set as VHIGH. Then, with the first slope, the word line WL is charged up to VHIGH-Vthnmos, which is roughly a voltage difference between VHIGH and the threshold voltages Vthnmos of the NMOS (FIG. 19C). VHIGH is applied to the second electrode 42b, and the PMOS 40 is turned off. Next, at a time point t62, the voltage to be applied to the second control electrode 44 is decreased from VHIGH to VSS, and the PMOS 40 is turned on. VSS is, for example, zero volt (0 volt). Accordingly, with the second slope, the word line WL is charged up to VHIGH.

The voltage can be increased at a high speed since NMOS has a relatively higher mobility compared to a PMOS of the same size, resulting in a lower ON resistance. Therefore, in the waveform generation circuit shown in FIGS. 19A, 19B, and 19C, NMOS is used during the period of the first slope in order to take advantage of the characteristics of the NMOS. Thereafter, the voltage is increased with the more gradual second slope using the PMOS 40 having an appropriate size (FIG. 19C).

The NMOS 50 may be ON or OFF when the voltage increases with the second slope. This is because the NMOS 50 does not pass a voltage equal to or higher than VHIGH-Vthnmos. Therefore, the PMOS may be turned on while the NMOS 50 is in an on state. The NMOS 50 may be turned off at the same time as a timing at which the PMOS 40 is turned off, or may be turned off first. Therefore, there is an advantage that the timing of controlling the NMOS 50 is facilitated.

The gate voltage (Vg1 input to the fifth control electrode 54) of the NMOS 50 can be set to, for example, Vg1−Vthnmos=Vslow, such that appropriate Vslow is applied. The slope of Vg1 when NMOS 50 is turned on can be equal or larger than the first slope. The slope of Vg1 when NMOS 50 is turned on, can be set equal to the first slope to control the slope of WL more precisely.

Figure 20:
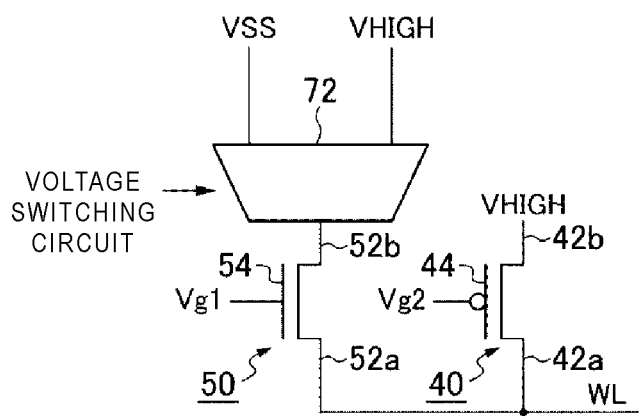
FIG. 20 shows another example of the waveform generation circuit used in the semiconductor storage device and the control method thereof according to the embodiment.
Figure 21A:
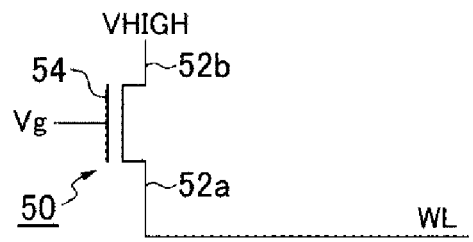
FIGS. 21A, 21B, and 21C show another example of the waveform generation circuit used in the semiconductor storage device and the control method thereof according to the embodiment.
Figure 21B:
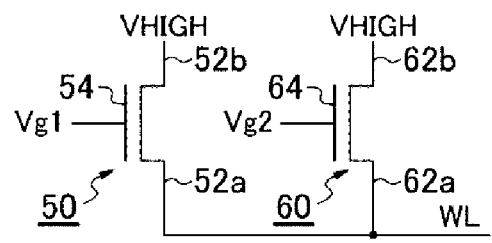
Figure 21C:
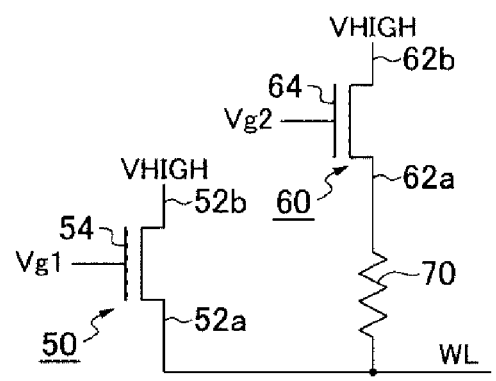
Figure 22:
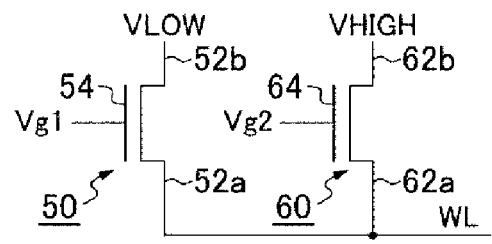
FIG. 22 shows another example of the waveform generation circuit used in the semiconductor storage device and the control method thereof according to the embodiment.
Figure 23:
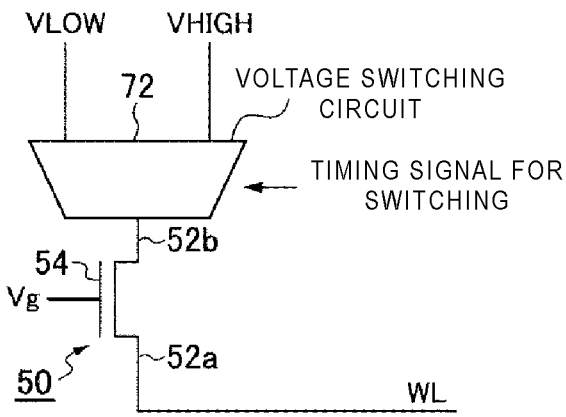
FIG. 23 shows another example of the waveform generation circuit used in the semiconductor storage device and the control method thereof according to the embodiment.
Figure 24:
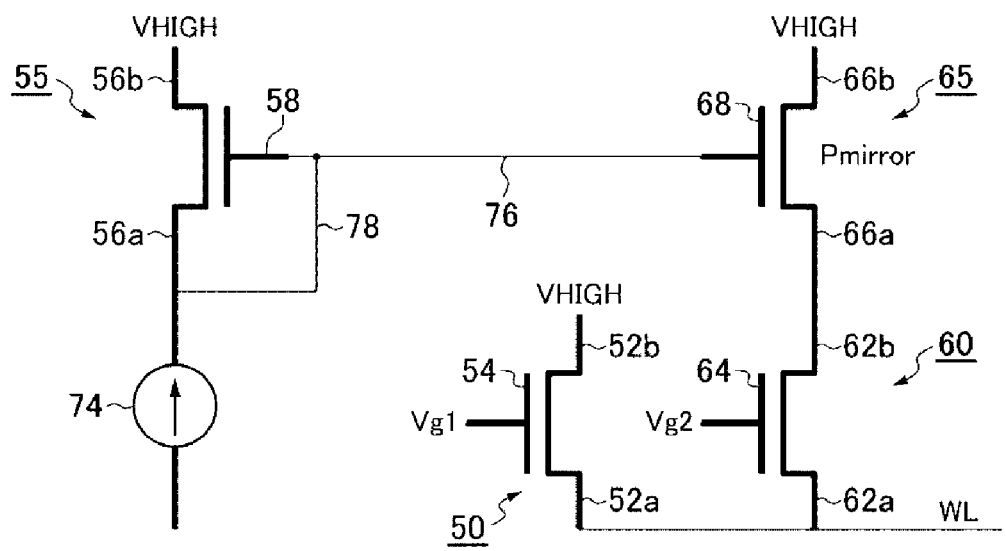
FIG. 24 shows another example of the waveform generation circuit used in the semiconductor storage device and the control method thereof according to the embodiment.
Figure 25:
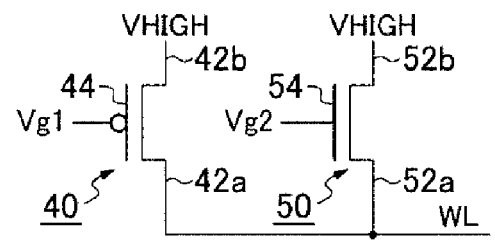
FIG. 25 shows another example of the waveform generation circuit used in the semiconductor storage device and the control method thereof according to the embodiment.
Figure 26:
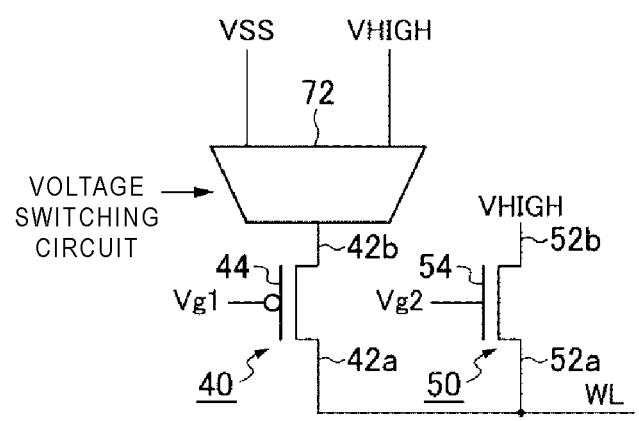
FIG. 26 shows another example of the waveform generation circuit used in the semiconductor storage device and the control method thereof according to the embodiment.

FIG. 20 shows another example of the waveform generation circuit used in the semiconductor storage device and the control method thereof according to the embodiment. It is preferable that a path for applying a non-selection voltage (for example, VSS) is provided in the word line WL since the specific word line WL may not be selected. Here, it is preferable to use the NMOS 50 in the path for applying the non-selection voltage since the non-selection voltage is lower than a selection voltage. In the case of the waveform generation circuit shown in FIGS. 19A, 19B, and 19C, the NMOS 50 is used to increase the voltage with the first slope. In the waveform generation circuit shown in FIG. 20, the NMOS 50 is used to further apply a non-selection voltage. Accordingly, a size of the semiconductor storage device can be reduced since the number of transistors used in the waveform generation circuit can be reduced. For this reason, as shown in FIG. 20, switching with the non-selection voltage VSS is facilitated when the voltage switching circuit 72 is used by being connected to the tenth electrode 52b.

In FIGS. 15A to 20, a case is shown in which, when the word line WL is selected, the word line WL is a high voltage side, the bit line BL is a low voltage side, and the voltage is applied to the word line WL after the bit line BL is placed into a floating state. On the other hand, it is preferable to use a waveform generation circuit in which the PMOS and the NMOS of the waveform generation circuit in FIGS. 15A to 20 are interchanged when in selecting the word line WL, the word line WL is the low voltage side, the bit line BL is the high voltage side, and the bit line BL is placed in the floating state. FIGS. 21A to 26 show an example of a waveform generation circuit using the NMOS 50 and an NMOS 60. Roles of the bit line BL and the word line WL may be reversed.

Figure 27A:
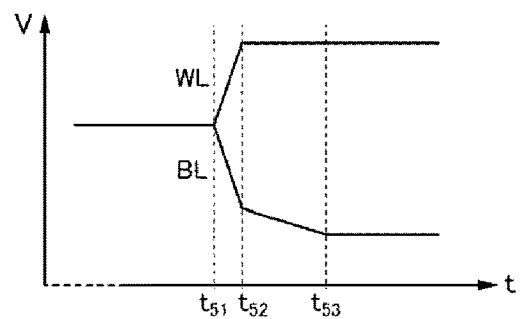
FIGS. 27A, 27B, 27C, 27D, and 27E show an example of changes in a voltage applied to the word line WL and the bit line BL in the methods of performing reading and writing on the memory cell according to the embodiment.
Figure 27B:
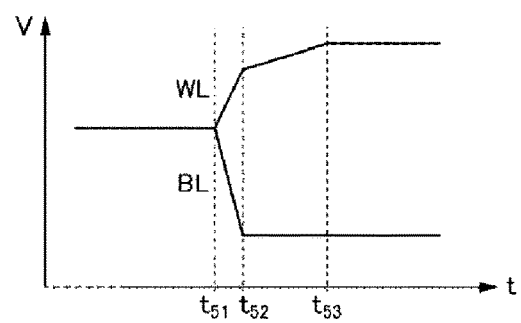
Figure 27C:
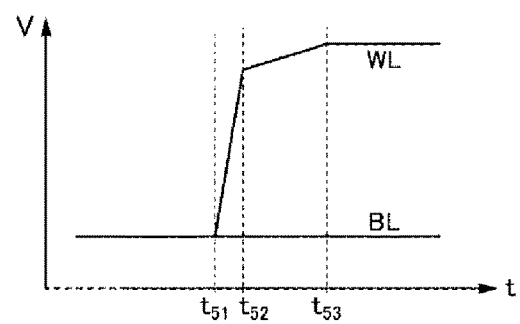
Figure 27D:
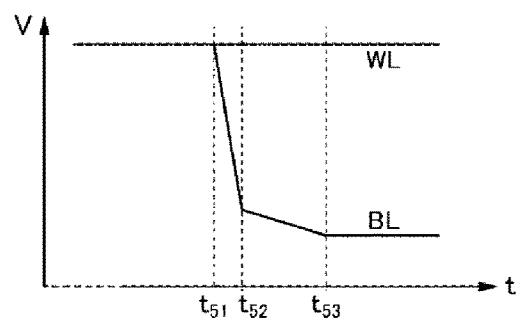
Figure 27E:
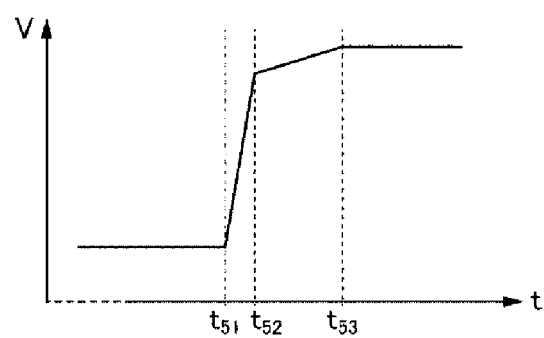

FIGS. 27A to 27D show an example of changes in a voltage to be applied to the word line WL and the bit line BL in the methods of performing reading and writing on the memory cell according to the embodiment. FIG. 27E shows the applied voltage of the memory cell according to the embodiment. Here, in the example shown in FIGS. 27A to 27E, the bit line BL is not placed in the floating state. In FIGS. 27A to 27E, the memory cell voltage increases with the first slope between the time points t51 and t52, and the memory cell voltage increases with the second slope between time points t52 and t53. With the voltage change shown in FIGS. 27A to 27E, a more reliable semiconductor storage device and the control method thereof can be provided.

The semiconductor storage device and the control method thereof according to the embodiment are preferably applied to, for example, the memory cell MC having a size of a cross-sectional area of equal to or less than 1 μm when viewed from a direction in which the word line WL and the bit line BL are stacked. This is because, generally, the smaller the size of the cross-sectional area, the larger the variation in the characteristic of the memory cell MC, and the larger the variation in the threshold voltage described above.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a first wiring;
   a second wiring;
   a memory cell including a first element configured to store data and a second element connected to the first element, the memory cell having a first end connected to the first wiring and a second end connected to the second wiring; and
   a control circuit configured to:
      during a read operation to read data from the memory cell, apply to the first wiring a voltage that increases with a first slope during a first period and with a second slope that is smaller than the first slope during a second period after the first period, and place the second wiring in an electrically floating state during at least the second period.

2. The semiconductor storage device according to claim 1, wherein
   the second wiring is not in the electrically floating state at any time during the first period.

3. The semiconductor storage device according to claim 1, wherein
   the second wiring is in the electrically floating state during a portion of the first period.

4. The semiconductor storage device according to claim 1, wherein
   the control circuit places the second wiring in the electrically floating state after a predetermined voltage is applied to the second wiring.

5. The semiconductor storage device according to claim 1, wherein
   the first element is a variable resistance element and is configured to store the data having a first value when in a low resistance state and a second value when in a high resistance state, and
   the second element is in a non-conductive state when the voltage applied to the memory cell is less than a threshold value, and is in a conductive state when the voltage applied to the memory cell is equal to or higher than the threshold value.

6. The semiconductor storage device according to claim 5, wherein the first element includes chalcogenide glass.

7. The semiconductor storage device according to claim 1, wherein one of the first and second wirings is a bit line, and the other one of the first and second wirings is a word line.

8. The semiconductor storage device according to claim 1, wherein the control circuit applies the voltage that increases with the first slope and then with the second slope using the first wiring and the second wiring during reading and writing of the memory cell.

9. The semiconductor storage device according to claim 1, further comprising:
   a plurality of third wirings extending in a first direction and parallel to the first wiring;
   a plurality of fourth wirings extending in a second direction that crosses the first direction and parallel to the second wiring; and
   a plurality of memory cells arranged in a matrix configuration between each pair of (i) the first wiring and the third wirings, and (ii) the second wiring and the fourth wirings.

10. A method of reading or writing a memory cell in a semiconductor storage device that includes first and second wirings, wherein the memory cell includes a first element configured to store data and a second element connected to the first element, the memory cell having a first end connected to the first wiring and a second end connected to the second wiring, said method comprising:
    during a read operation to read data from the memory cell, applying to the first wiring a voltage that increases with a first slope during a first period and with a second slope that is smaller than the first slope during a second period after the first period, and placing the second wiring in an electrically floating state during at least the second period.

11. The method according to claim 10, wherein
    the second wiring is not in the electrically floating state at any time during the first period.

12. The method according to claim 10, wherein
    the second wiring is in the electrically floating state during a portion of the first period.

13. The method according to claim 10, wherein
    the second wiring is placed in the electrically floating state after a predetermined voltage is applied to the second wiring.

14. The method according to claim 11, wherein
    the first element is a variable resistance element and is configured to store the data having a first value when in a low resistance state and a second value when in a high resistance state, and
    the second element is in a non-conductive state when the voltage applied to the memory cell is less than a threshold value, and is in a conductive state when the voltage applied to the memory cell is equal to or higher than the threshold value.

15. The method according to claim 14, wherein the first element includes chalcogenide glass.

16. The method according to claim 10, wherein one of the first and second wirings is a bit line, and the other one of the first and second wirings is a word line.

17. The method according to claim 10, wherein the semiconductor storage device further includes:
    a plurality of third wirings extending in a first direction and parallel to the first wiring;
    a plurality of fourth wirings extending in a second direction that crosses the first direction and parallel to the second wiring; and
    a plurality of memory cells arranged in a matrix configuration between each pair of (i) the first wiring and the third wirings, and (ii) the second wiring and the fourth wirings.

18. The method according to claim 10, further comprising:
    setting the second period as a time period for applying to the first wiring the voltage that increase with the second slope.

* * * * *

UNITED STATES PATENT AND TRADEMARK OFFICE
CERTIFICATE OF CORRECTION

| | | |
|---|---|---|
| PATENT NO. | : 11,257,536 B2 | |
| APPLICATION NO. | : 17/002512 | |
| DATED | : February 22, 2022 | |
| INVENTOR(S) | : Takayuki Miyazaki | |

It is certified that error appears in the above-identified patent and that said Letters Patent is hereby corrected as shown below:

In the Claims

In Claim 8, Line 62, please delete "reading and".
In Claim 14, Line 34, please delete "11" and replace with --10--.

Signed and Sealed this
Twentieth Day of December, 2022

Katherine Kelly Vidal
*Director of the United States Patent and Trademark Office*